United States Patent
Hsieh et al.

(10) Patent No.: US 11,371,133 B2
(45) Date of Patent: Jun. 28, 2022

(54) UNDERCUT-FREE PATTERNED ALUMINUM NITRIDE STRUCTURE AND METHODS FOR FORMING THE SAME

(71) Applicant: Taiwan Semiconductor Manufacturing Company Limited, Hsinchu (TW)

(72) Inventors: Yuan-Chih Hsieh, Hsinchu (TW); Yi-Ren Wang, New Taipei (TW); Hung-Hua Lin, Taipei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 143 days.

(21) Appl. No.: 16/931,574

(22) Filed: Jul. 17, 2020

(65) Prior Publication Data
US 2022/0018009 A1 Jan. 20, 2022

(51) Int. Cl.
*B81B 7/00* (2006.01)
*C23C 8/34* (2006.01)
(Continued)

(52) U.S. Cl.
CPC ............. *C23C 8/34* (2013.01); *B81B 7/0006* (2013.01); *B81C 1/00095* (2013.01);
(Continued)

(58) Field of Classification Search
CPC ... C23C 8/34; B81B 7/0006; B81B 2207/094; B81B 2201/0257; B81B 2207/07;
(Continued)

(56) References Cited

U.S. PATENT DOCUMENTS

2017/0368574 A1\* 12/2017 Sammoura ............ H01L 41/332
2020/0189909 A1\* 6/2020 Qian ..................... B81B 7/0077
(Continued)

FOREIGN PATENT DOCUMENTS

| EP | 3528291 A1 | 8/2019 |
| TW | 201802976 A | 1/2018 |
| TW | 201916292 A | 4/2019 |

OTHER PUBLICATIONS

Taiwan Patent and Trademark Office, TW Application No. 11020774810, Office Action dated Aug. 10, 2021, 4 pages.

*Primary Examiner* — Yasser A Abdelaziez
(74) *Attorney, Agent, or Firm* — The Marbury Law Group, PLLC

(57) ABSTRACT

A microstructure may be provided by forming a metal layer such as a molybdenum layer over a substrate. An aluminum nitride layer is formed on a top surface of the metal layer. A surface portion of the aluminum nitride layer is converted into a continuous aluminum oxide-containing layer by oxidation. A dielectric spacer layer may be formed over the continuous aluminum oxide-containing layer. Contact via cavities extending through the dielectric spacer layer, the continuous aluminum oxide-containing layer, and the aluminum nitride layer and down to a respective portion of the at least one metal layer may be formed using etch processes that contain a wet etch step while suppressing formation of an undercut in the aluminum nitride layer. Contact via structures may be formed in the contact via cavities. The microstructure may include a micro-electromechanical system (MEMS) device containing a piezoelectric transducer.

20 Claims, 17 Drawing Sheets

(51) Int. Cl.
  *B81C 1/00* (2006.01)
  *B81C 3/00* (2006.01)
(52) U.S. Cl.
  CPC .......... *B81C 1/00269* (2013.01); *B81C 3/001* (2013.01); *B81B 2207/094* (2013.01); *B81C 2201/0154* (2013.01); *B81C 2203/0118* (2013.01)
(58) Field of Classification Search
  CPC ... B81B 7/02; B81C 1/00095; B81C 1/00269; B81C 3/001; B81C 2201/0154; B81C 2203/0118; B81C 1/00571; B81C 1/00015; B81C 2201/01; H01L 23/5226; H01L 21/76822; H01L 23/528; H01L 41/0805; H01L 41/09; H01L 41/18; H01L 41/22; H01L 2221/1005; H01L 41/35; H01L 21/768; H01L 21/7681; H01L 21/76811; H01L 21/76814; H01L 21/76829; H01L 21/76834; H01L 21/76835; H01L 21/7685; H01L 21/76853; H01L 21/76855; H01L 21/76861; H01L 21/76864
  See application file for complete search history.

(56) References Cited

U.S. PATENT DOCUMENTS

| | | | |
|---|---|---|---|
| 2020/0411749 A1* | 12/2020 | Chen | H01L 41/293 |
| 2021/0206630 A1* | 7/2021 | Qian | B06B 1/06 |
| 2021/0260623 A1* | 8/2021 | Qian | B81B 3/0021 |

* cited by examiner

UNDERCUT-FREE PATTERNED ALUMINUM NITRIDE STRUCTURE AND METHODS FOR FORMING THE SAME

BACKGROUND

The present disclosure is directed to semiconductor devices, and specifically to a patterned structure including aluminum nitride structures such as a piezoelectric microelectromechanical system (MEMS) and methods of forming the same.

Aluminum nitride is commonly used in MEMS devices. However, integration of aluminum nitride components and conductive structures into MEMS devices poses a challenge due to significantly different material characteristics between aluminum nitride and conductive materials.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
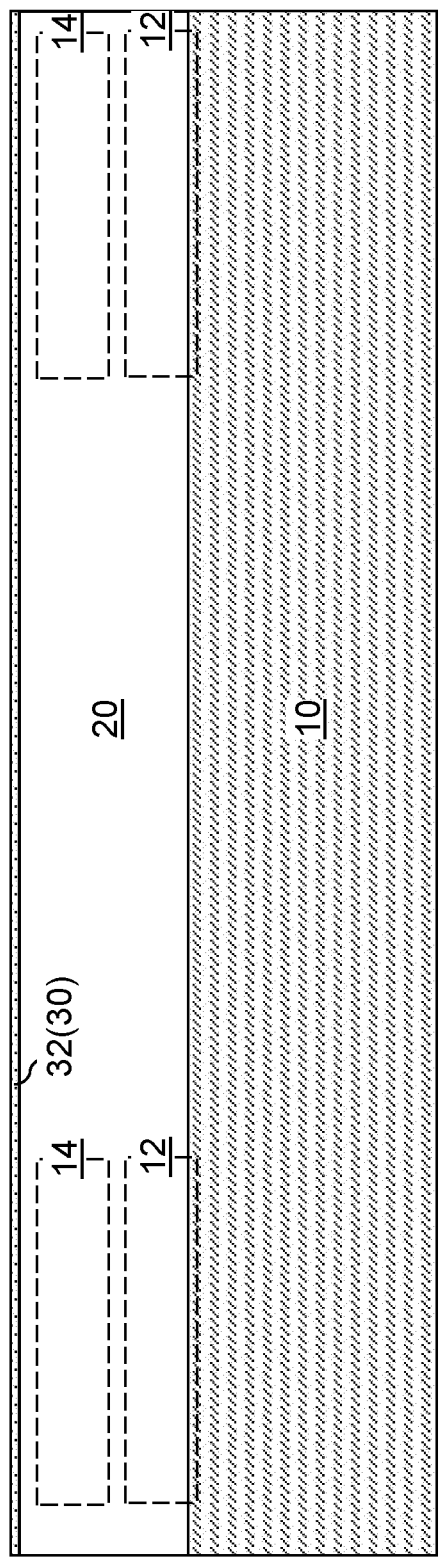
FIG. 1 is a vertical cross-sectional view of an exemplary structure after formation of at least one dielectric buffer layer and a proximal aluminum nitride layer over a substrate according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to an aspect of the present disclosure, an aluminum nitride layer that may be used to form a microstructure is protected from an undercut at an interface with a dielectric material layer including an oxide, an oxynitride, or a nitride of a semiconductor material by converting a surface portion of the aluminum nitride layer into an aluminum oxide-containing layer. The aluminum oxide-containing layer may include stoichiometric aluminum oxide ($Al_2O_3$) or may include a compound of aluminum, oxygen, and nitrogen. The oxygen content in a distal portion of the aluminum oxide-containing layer located at an opposite side of the interface with the remaining portion of the aluminum nitride layer may be sufficiently high so that the crystalline structure of aluminum nitride is not present at a distal surface of the aluminum oxide-containing layer, i.e., at the opposite side of the interface. A dielectric spacer layer including a dielectric material such as silicon oxide, silicon nitride, or silicon oxynitride may be formed on the distal surface of the aluminum oxide-containing layer. The absence of the crystalline structure of aluminum nitride at the distal surface of the aluminum oxide-containing layer provides formation of a gap-free interface between the aluminum oxide-containing layer and the dielectric spacer layer, which renders the layer stack of the aluminum nitride layer, the aluminum oxide-containing layer, and the dielectric spacer layer resistant to formation of any undercut during a subsequent isotropic etch process that uses an isotropic etchant. Specifically, formation of an undercut at the interface between the dielectric spacer layer and the aluminum oxide-containing layer may be suppressed during the subsequent isotropic etch process.

Aluminum nitride is a piezoelectric material and is utilized in many MEMS devices. For reasons not completely understood, an interface between an aluminum nitride layer and a silicon oxide layer is prone to an undercut during a wet etch process such as a wet etch process using phosphoric acid, which is a typical etchant for aluminum nitride. This may be due to the roughness of the aluminum nitride layer and/or the weak wetting ability of the silicon oxide layer with aluminum nitride or a combination of both. Capillary action may allow the wet etchant (e.g., phosphoric acid) to penetrate the interface of the silicon oxide and aluminum nitride. The lateral extent of the undercut in an upper portion of the aluminum nitride layer and an overlying silicon oxide layer may be typically 3-8 times the thickness of the etched aluminum nitride layer. Apparently, an interfacial etch mechanism that accelerates the aluminum nitride material is at play at the interface. Such an undercut in a patterned stack of an aluminum nitride layer and a silicon oxide layer is disadvantageous for proper functionality of the aluminum nitride layer, for example, as a piezoelectric component of an MEMS device.

Referring to FIG. 1, an exemplary structure according to an embodiment of the present disclosure is illustrated. The exemplary structure may include a substrate 10, which may be a semiconductor substrate such as a commercially available silicon substrate. Semiconductor devices 12 may be optionally formed on a top surface of the substrate 10. For example, the semiconductor devices 12 may include transistor such a complementary metal-oxide-semiconductor (CMOS) field effect transistors and/or bipolar transistors. The semiconductor devices 12 may include passive devices such a capacitors, resistors, and/or inductors, and may include radio frequency (RF) devices, diodes, varactors, and/or additional semiconductor devices known in the art.

At least one dielectric buffer layer 20 may be formed over the top surface of the substrate 10. The at least one dielectric buffer layer 20 includes at least one dielectric material that may provide electrical isolation of overlying structures to be subsequently formed from the substrate 10. In one embodiment, the at least one dielectric buffer layer 20 may include interconnect-level dielectric material layers that may have formed within metal interconnect structures 14. The metal interconnect structures 14 may provide electrical connection to and from the semiconductor devices 12, and may provide electrical connection between a respective pair of a semiconductor device 12 and a respective portion of a microelectromechanical system (MEMS) device to be subsequently formed over the at least one dielectric buffer layer 20 and/or between a respective pair of a semiconductor device 12 and contact via structures to be subsequently formed over the at least one dielectric buffer layer 20.

In one embodiment, each of the at least one dielectric buffer layer 20 may include a dielectric material such as undoped silicate glass, a doped silicate glass, organosilicate glass, amorphous fluorinated carbon, porous variants thereof, or combinations thereof. Each of the metal interconnect structures 14 may include at least one conductive material, which may be a combination of a metallic liner layer (such as a metallic nitride or a metallic carbide) and a metallic fill material. Each metallic liner layer may include TiN, TaN, WN, TiC, TaC, and WC, and each metallic fill material portion may include W, Cu, Al, Co, Ru, Mo, Ta, Ti, alloys thereof, and/or combinations thereof. Other suitable materials may be used within the contemplated scope of the disclosure.

An aluminum nitride layer 30 may be formed on the topmost surface of the at least one dielectric buffer layer 20. Generally, at least one aluminum nitride layer 30 (which may be a single aluminum nitride layer or a plurality of aluminum nitride layers located at different levels) may be formed over the at least one dielectric buffer layer 20. In embodiments in which more than one aluminum nitride layer 30 is formed over the at least one dielectric buffer layer 20, the aluminum nitride layer 30 that is formed at this processing step is herein referred to as a proximal aluminum nitride layer 32, or as a bottommost aluminum nitride layer 32. The proximal aluminum nitride layer 32 is the most proximal one to the substrate 10 selected from all of the aluminum nitride layers 30 that may be formed over the at least one dielectric buffer layer 20.

The proximal aluminum nitride layer 32 may be deposited by atomic layer deposition (ALD) using an aluminum-containing precursor gas and a nitrogen-containing precursor gas. For example, the proximal aluminum nitride layer 32 may be deposited by a combination of tris(diethylamido) aluminum(III) (TDEAA) and hydrazine ($N_2H_4$) or ammonia ($NH_3$) at a deposition temperature in a range from 150 degrees Celsius to 300 degrees Celsius. Alternatively, plasma-enhanced atomic layer deposition may be used to deposit aluminum nitride at a lower temperature, which may be, for example, in a range from zero degree Celsius to 150 degrees Celsius. Still further, aluminum nitride may be deposited by physical vapor deposition (PVD), i.e., sputtering. The thickness of the proximal aluminum nitride layer 32 may be in a range from 3 nm to 100 nm, such as from 6 nm to 50 nm, although lesser and greater thicknesses may also be used.

Figure 2A:
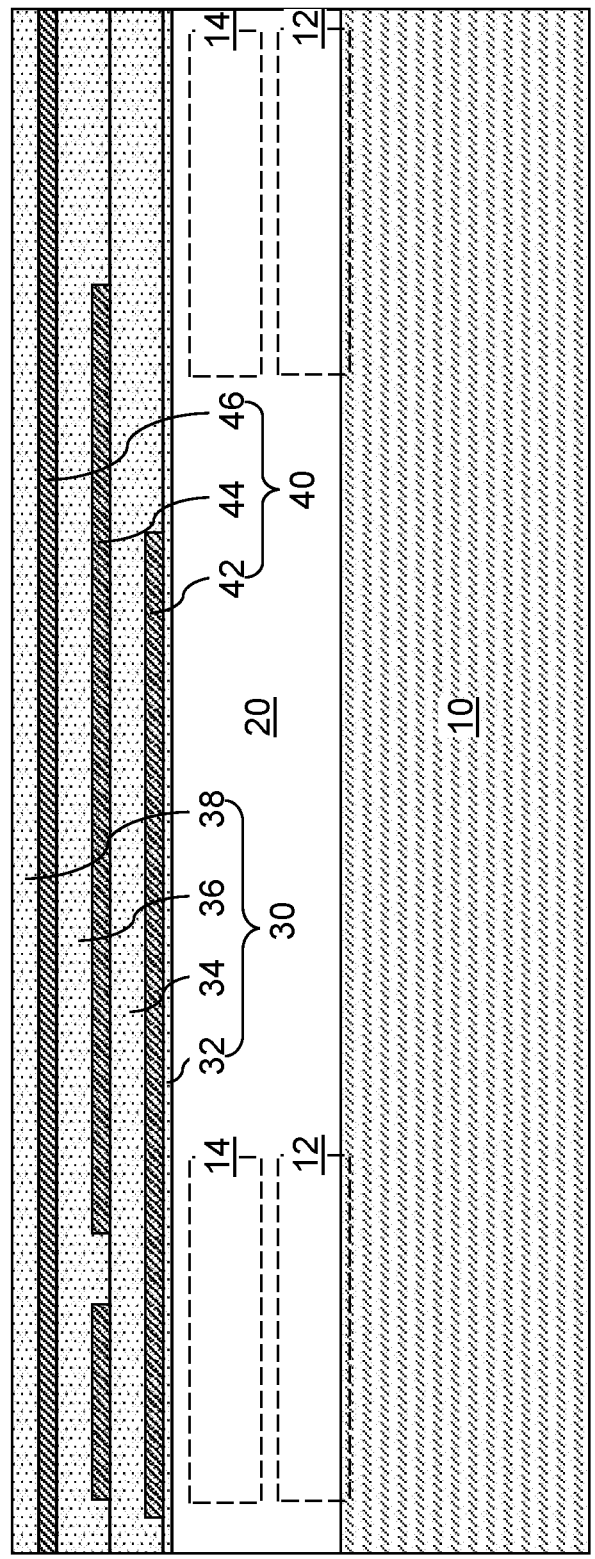
FIG. 2A is a vertical cross-sectional view of the exemplary structure after formation of metal layers and aluminum nitride layers according to an embodiment of the present disclosure.

Referring to FIG. 2A, metal layers 40 and additional aluminum nitride layers 30 may be alternately formed over the proximal aluminum nitride layer 32. Each metal layer 40 may be patterned upon deposition prior to deposition of the next aluminum nitride layer 30. For example, a photoresist layer (not shown) may be applied over a metal layer 40, and may be lithographically patterned to cover an area of the metal layer 40 without covering another area of the metal layer 40. An anisotropic etch process may be performed to transfer the pattern in the photoresist layer through the metal layer 40, thereby patterning the metal layer 40.

Figure 2C:
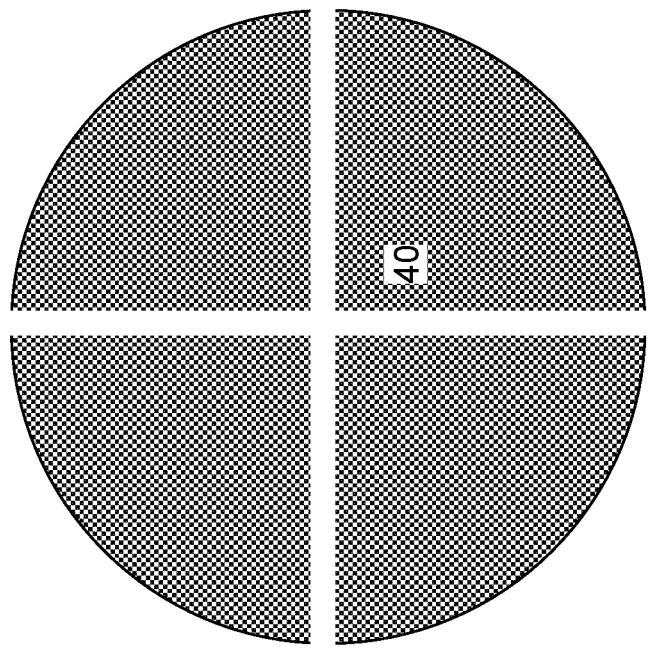
FIG. 2C is a horizontal cross-sectional view of a second exemplary pattern of a metal layer in the exemplary structure of FIG. 2A.
Figure 2B:
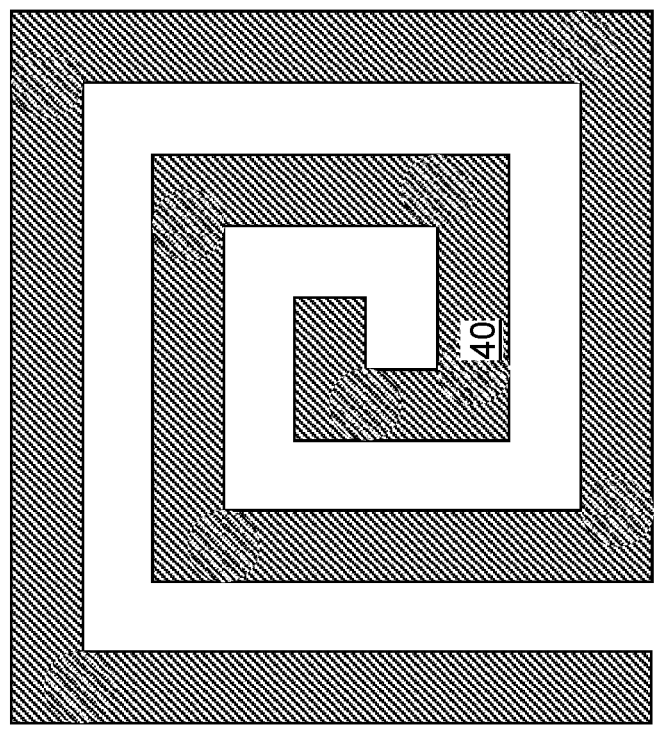
FIG. 2B is a horizontal cross-sectional view of the first exemplary pattern of a metal layer in the exemplary structure of FIG. 2A.

The pattern of each metal layer 40 may be selected to provide a suitable microstructure (a structure having at least one dimension less than 10 microns), which may be a micro-electromechanical system (MEMS) device. FIGS. 2B and 2C illustrate in a horizontal view, non-limiting exemplary shapes for a metal layer 40 that may be used in the exemplary structure. Generally, each metal layer 40 may be patterned into any suitable shape that is conducive to optimal performance of the MEMS device to be formed within the exemplary structure. In one embodiment, the microstructure comprises a micro-electromechanical system (MEMS) device containing a piezoelectric transducer that uses at least one, and/or all, of the aluminum nitride layers 30 as a piezoelectric conversion element, and uses a subset of contact via structures to be subsequently formed as electrical nodes for the piezoelectric transducer.

Referring back to FIG. 2A, a plurality of additional aluminum nitride layers 30 and a plurality of metal layers 40 may be formed over the proximal aluminum nitride layer 32. In one embodiment, the plurality of additional aluminum nitride layers 30 may include a first intermediate aluminum nitride layer 34, a second intermediate aluminum nitride layer 36, and a distal aluminum nitride layer 38. In one embodiment, the plurality of metal layers 40 may include a proximal metal layer 42 (which is also referred to as a bottom metal layer), an intermediate metal layer 44, and a distal metal layer 46 (which is also referred to as a top metal layer). An alternating sequence of metal layers 40 and aluminum nitride layers 30 may be formed.

While the present disclosure is described using an embodiment in which three metal layers 40 are used, embodiments are expressly contemplated herein in which one metal layer 40, two metal layers 40, four metal layers 40, or five or more metal layers 40 are used. Further, while the present disclosure is described using an embodiment in which four aluminum nitride layers 30 are used, embodiments are expressly contemplated herein in which two aluminum nitride layers 30, three aluminum nitride layer 30, five aluminum nitride layers 30, or six ore more aluminum nitride layers are used. While the present disclosure is described using an embodiment in which each metal layer 40 is patterned prior to deposition of the next aluminum nitride layer 30, embodiments are expressly contemplated herein in which a combination of a metal layer 40 and an aluminum nitride layer 30 is patterned simultaneously.

The metal layers 40 may be formed in the aluminum nitride layers 30, which may collectively function as a dielectric matrix having formed there within the metal layers 40. In such embodiments, the aluminum nitride layers 30 may function as interlayer dielectric material layers that provide vertical isolation between vertically neighboring pairs of metal layers 40. The interlayer dielectric material layers overlie the substrate 10 and have formed therein the aluminum nitride layers 30 (i.e., 32, 34, 36, 38). The interlayer dielectric material layers (comprising a collection of the aluminum nitride layers 30) includes the distal aluminum nitride layer 38 (i.e., the topmost aluminum nitride layer) that overlies the distal metal layer 46 (which is the topmost metal layer selected from the metal layers 40).

Each of the metal layers 40 may be deposited by a respective deposition method, which may be selected from chemical vapor deposition, physical vapor deposition, atomic layer deposition, vacuum evaporation, or other thin film deposition methods. Each of the metal layers 40 may include, and/or may consist essentially of, a suitable metallic material having a lattice constant that matches the lattice constant of aluminum nitride. In one embodiment, at least one, or each, of the metal layers 40 may include, and/or may consist essentially of, molybdenum. In one embodiment, each of the metal layers 40 may have a thickness in a range from 5 nm to 100 nm, such as from 10 nm to 50 nm, although lesser and greater thicknesses may also be used. In one embodiment, a plurality of metal layers 40 may include, and/or may consist essentially of, a plurality of molybdenum layers having a respective thickness in a range from 5 nm to 100 nm.

Each of the additional aluminum nitride layers (34, 36, 38) may be deposited using any of the deposition methods that may be used to deposit the proximal aluminum nitride layer 32. The atomic percentage of the aluminum atoms in each aluminum nitride layer 30 may be 50%, or may be greater than 50% and less than 52% in case a respective aluminum nitride layer 30 is aluminum rich, i.e., nitrogen deficient. Each of the additional aluminum nitride layers 30 other than the distal aluminum nitride layer 38 may have a thickness in a range from 3 nm to 100 nm, such as from 6 nm to 50 nm, although lesser and greater thicknesses may also be used. The distal aluminum nitride layer 38 may have a thickness in a range from 4 nm to 120 nm, such as from 8 nm to 70 nm, although lesser and greater thicknesses may also be used.

Figure 3A:
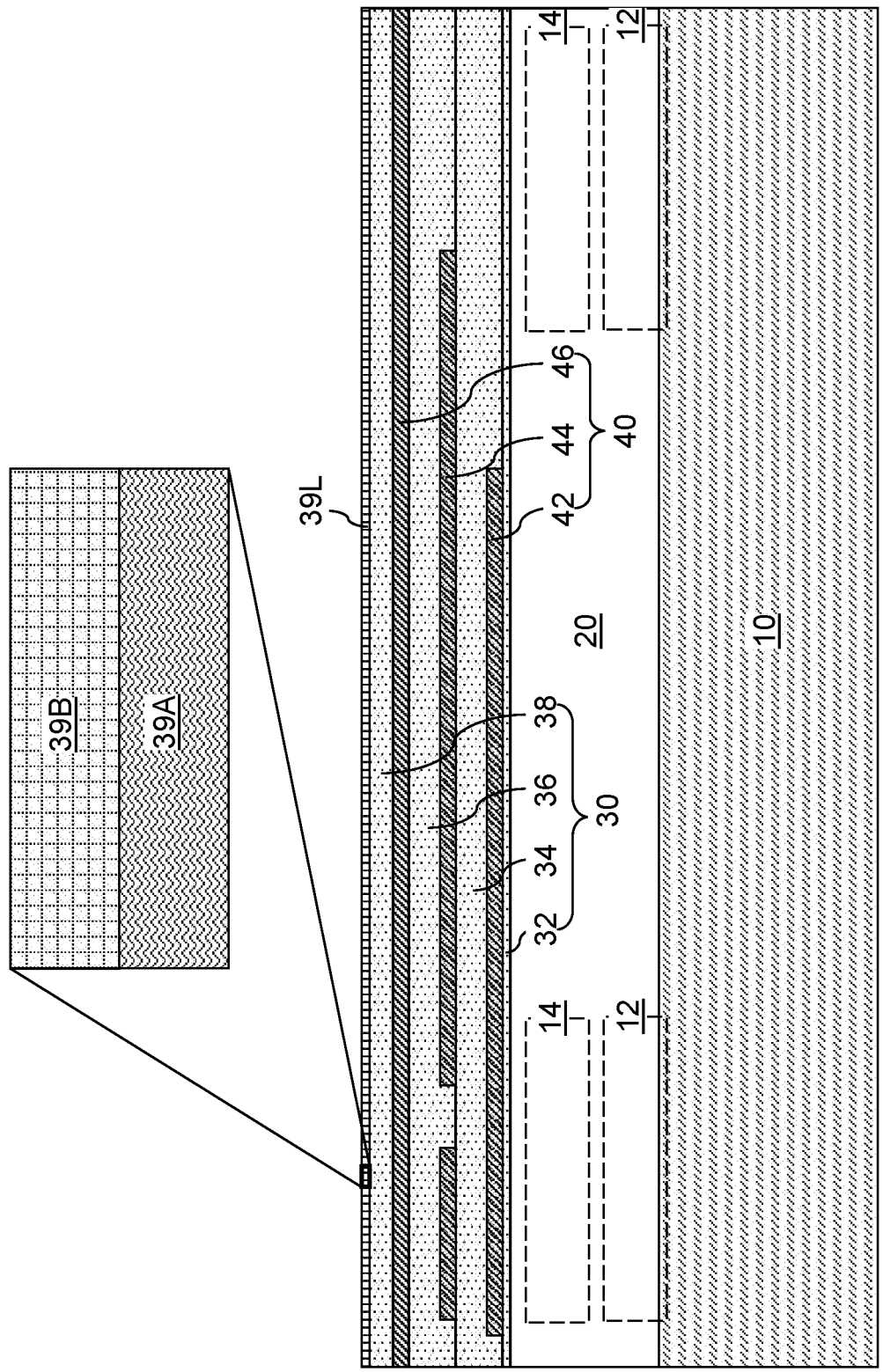
FIG. 3A is a vertical cross-sectional view of a first exemplary configuration of the exemplary structure after converting a surface portion of the aluminum nitride layer into a continuous aluminum oxide-containing layer according to an embodiment of the present disclosure.
Figure 3B:
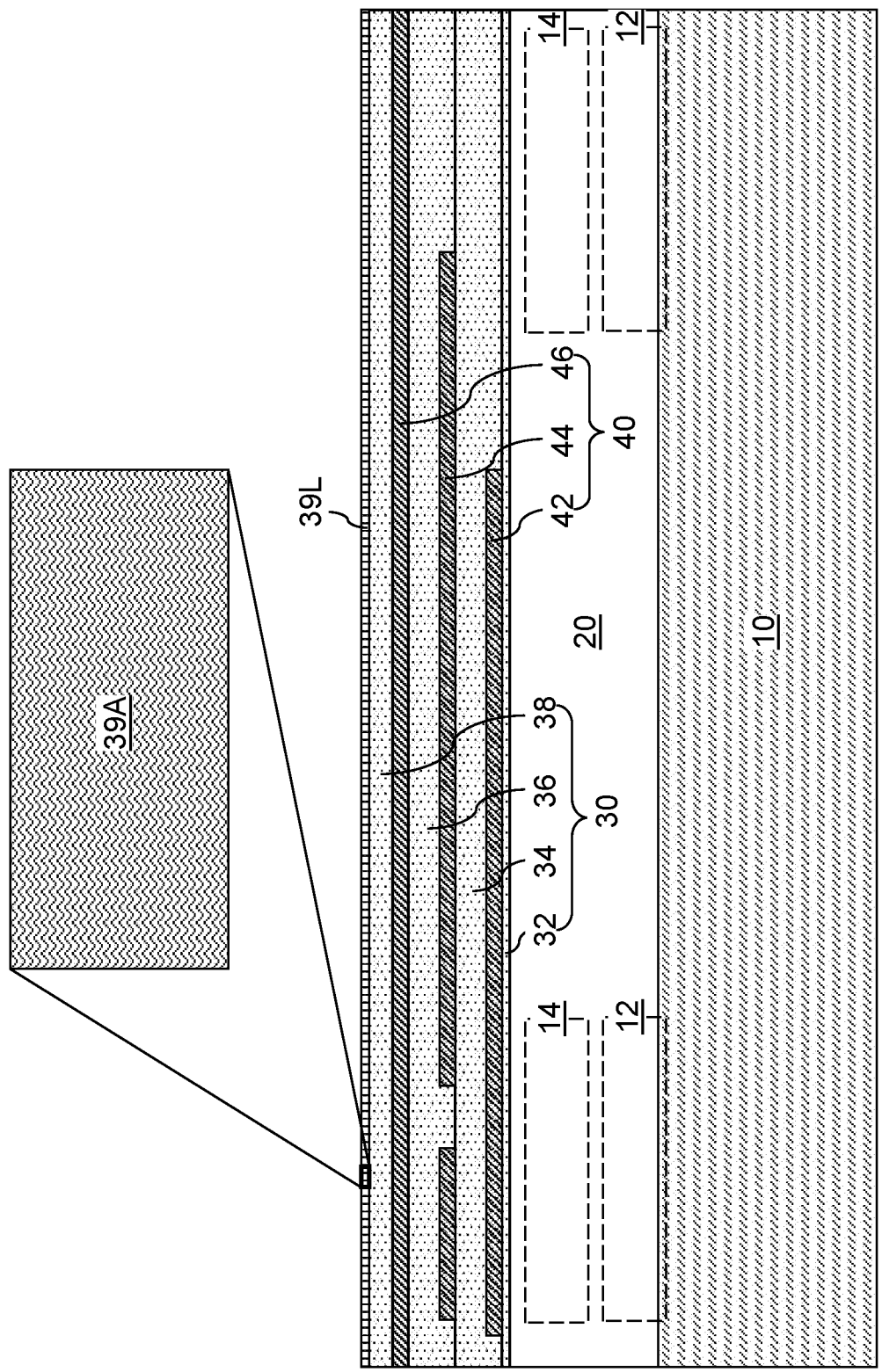
FIG. 3B is a vertical cross-sectional view of a second exemplary configuration of the exemplary structure after converting a surface portion of the aluminum nitride layer into a continuous aluminum oxide-containing layer according to an embodiment of the present disclosure.

Referring to FIGS. 3A and 3B, a surface portion of the distal aluminum nitride layer 38 (i.e., the topmost aluminum nitride layer) may be converted into a continuous aluminum oxide-containing layer 39L by performing an oxidation process. The unconverted portion of the distal aluminum nitride layer 38 remains as a distal aluminum nitride layer 38, and may include stoichiometric or non-stoichiometric aluminum nitride consisting essentially of aluminum atoms and nitrogen atoms. The distal aluminum nitride layer 38 after the oxidation process (i.e., after the surface portion is converted into the continuous aluminum oxide-containing layer 39L) may have a thickness in a range from 3 nm to 100 nm, such as from 6 nm to 50 nm, although lesser and greater thicknesses may also be used.

The oxidation process that converts a surface portion of the distal aluminum nitride layer 38 as provided at the processing steps of FIG. 2A into the continuous aluminum oxide-containing layer 39L may include a plasma oxidation process and/or may include a thermal oxidation process. For example, a plasma oxidation process using a radio frequency plasma of $O_2$ at a temperature of 400 degrees Celsius may be used to convert the surface portion of the distal aluminum nitride layer 38 as provided at the processing steps of FIG. 2A into the continuous aluminum oxide-containing layer 39L. The thickness of the continuous aluminum oxide-containing layer 39L may be in a range from 1 nm to 20 nm, such as from 2 nm to 15 nm, although lesser and greater thicknesses may also be used.

Generally, the atomic oxygen concentration in the continuous aluminum oxide-containing layer 39L tends to increases with a vertical distance from the interface with the distal aluminum nitride layer 38. The distal aluminum nitride layer 38 may consist essentially of aluminum atoms and nitrogen atoms, and the continuous aluminum oxide-containing layer 39L include regions that contain aluminum atoms, nitrogen atoms, and oxygen atoms above trace level, i.e., above 100 parts per million. Generally, the continuous aluminum oxide-containing layer 39L comprises a graded aluminum nitride-oxide layer 39A having a compositional gradient in which the oxygen atomic concentration increases from zero at an interface with the distal aluminum nitride layer 38 to a percentage in a range from 50% to 60% at a distal surface that is spaced from the interface with the distal aluminum nitride layer 38. Depending on the thickness of the continuous aluminum oxide-containing layer 39L, and depending on the process parameters used to form the continuous aluminum oxide-containing layer 39L, a topmost portion of the continuous aluminum oxide-containing layer 39L may, or may not, include nitrogen atoms.

FIG. 3A illustrates a first exemplary configuration of the exemplary structure in which a topmost portion of the continuous aluminum oxide-containing layer 39L includes an aluminum oxide material that is free of nitrogen atoms, which may be a stoichiometric aluminum oxide material having the material composition of $Al_2O_3$. In this case, the continuous aluminum oxide-containing layer 39L comprises an aluminum oxide layer 39B that contacts the graded aluminum nitride-oxide layer 39A at the distal surface. The oxygen atomic concentration may be 60% at the distal surface. Thus, the atomic concentration of oxygen atoms in the continuous aluminum oxide-containing layer 39L may gradually increase from 0% at an interface with the distal aluminum nitride layer 38 to 60% at an interface with the aluminum oxide layer 39B within the graded aluminum nitride-oxide layer 39A, and may be at 60% within the aluminum oxide layer 39B. The aluminum oxide layer 39B may consist of aluminum oxide. In one embodiment, the thickness of the graded aluminum nitride-oxide layer 39A may be in a range from 1 nm to 15 nm, such as from 3 nm to 6 nm, and the thickness of the aluminum oxide layer 39B may be in a range from 0.3 nm to 14 nm, although lesser and greater thicknesses may be used for each.

FIG. 3B illustrates a second exemplary configuration of the exemplary structure in which a topmost portion of the continuous aluminum oxide-containing layer 39L includes an aluminum oxide nitride material that includes nitrogen atoms. In this case, the continuous aluminum oxide-containing layer 39L may consist of a graded aluminum nitride-oxide layer 39A having a compositional gradient in which the oxygen atomic concentration increases from zero at an interface with the distal aluminum nitride layer 38 (i.e., the topmost aluminum nitride layer) to a percentage that is equal to or greater than 50% and less than 60% at a physically exposed distal surface that is spaced from the interface with the distal aluminum nitride layer 38. In this case, a dielectric spacer layer may be subsequently deposited directly on the distal surface of the graded aluminum nitride-oxide layer 39A. In one embodiment, the thickness of the graded aluminum nitride-oxide layer 39A (which is the same as the thickness of the continuous aluminum oxide-containing layer 39L in this case) may be in a range from 1 nm to 15 nm, such as from 3 nm to 6 nm, although lesser and greater thicknesses may be also be used.

Figure 4:
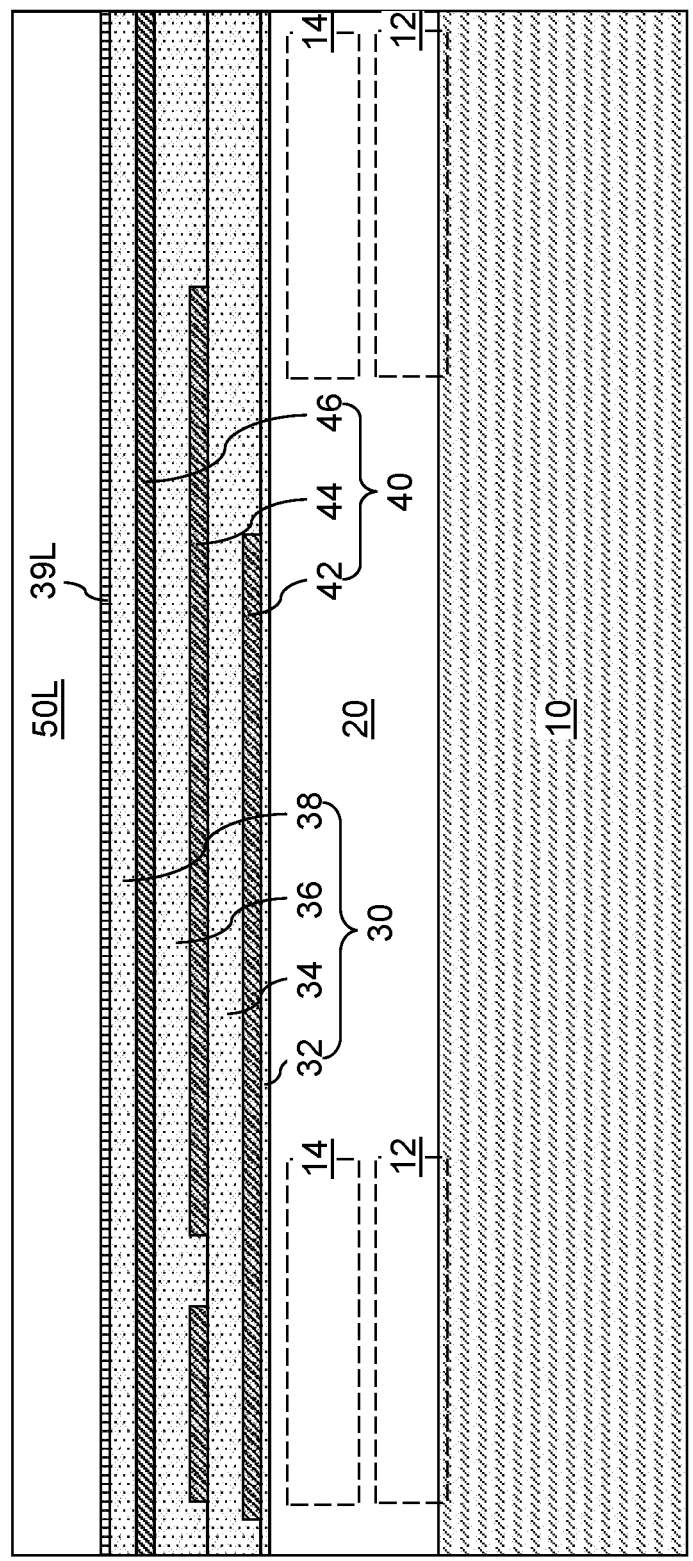
FIG. 4 is a vertical cross-sectional view of the exemplary structure after formation of a dielectric spacer layer according to an embodiment of the present disclosure.

Referring to FIG. 4, a dielectric spacer layer 50L may be formed over, and directly on, the physically exposed distal surface (i.e., the top surface) of the continuous aluminum oxide-containing layer 39L. In one embodiment, the dielectric spacer layer 50L may be free of a metallic element. In one embodiment, the dielectric spacer layer 50L may be free of a dielectric metal oxide, a dielectric metal nitride, or a dielectric metal oxynitride. In one embodiment, the dielectric spacer layer 50L may include a metallic-element-free dielectric material such as silicon oxide, silicon nitride, silicon oxynitride, organosilicate glass, polyimide, or a silicon-based inorganic polymer. In one embodiment, the dielectric spacer layer 50L may include, and/or may consist essentially of, a silicon oxide material such as undoped silicate glass or a doped silicate glass. The dielectric spacer layer 50L may be deposited by plasma enhanced chemical vapor deposition or high density plasma chemical vapor deposition, and may have a thickness in a range from 100 nm to 2,000 nm, such as from 200 nm to 1,000 nm, although lesser and greater thicknesses may also be used.

Generally, the distal aluminum nitride layer 38, the continuous aluminum oxide-containing layer 39L, and the dielectric spacer layer 50L may be formed over at least one metal layer 40. At least two contact via structures contacting a respective portion of the at least one metal layer 40 may be formed in subsequent processing steps. The dielectric spacer layer 50L may be patterned during formation of the at least one contact via structure to form at least two dielectric spacer structures. FIGS. 5-11 illustrate an exemplary sequence of processing steps that may be used to form the at least two contact via structures. It is understood, however, that the processing steps illustrated in FIGS. 5-11 are only exemplary, and other processing steps may be used to form the at least two contact via structures on the at least one metal layer 40 and/or on the metal interconnect structures 14 formed within the at least one dielectric buffer layer 20.

Figure 5:
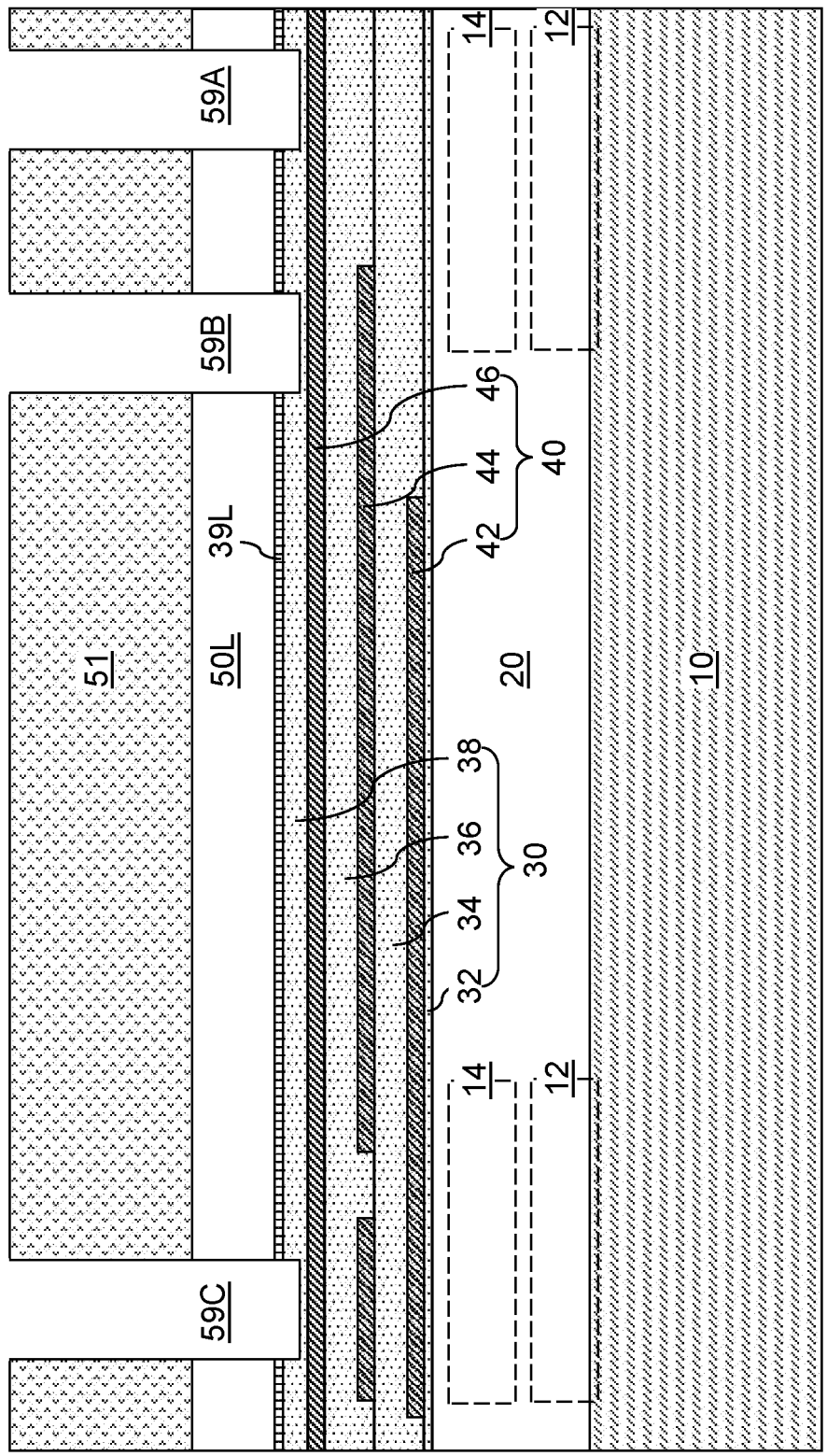
FIG. 5 is a vertical cross-sectional view of the exemplary structure after formation of contact via cavities through the dielectric spacer layer and the continuous aluminum oxide-containing layer according to an embodiment of the present disclosure.

Referring to FIG. 5, a first photoresist layer 51 may be applied over the dielectric spacer layer 50L, and may be lithographically patterned to form openings therethrough. Each of the openings in the first photoresist layer 51 may be formed within a respective area in which a contact via structure extending to one of the at least one metal layers 40 (which include the distal metal layer 46) and/or to one of the metal interconnect structures 14 (such as a metal line) formed within the at least one dielectric buffer layer 20.

An etch process may be performed to transfer the pattern in the first photoresist layer 51 through the dielectric spacer layer 50L and the continuous aluminum oxide-containing layer 39L, and optionally into an upper portion of the distal aluminum nitride layer 38. The etch process may include an anisotropic etch process and/or an isotropic etch process. The etch process may include a plurality of etch steps that may sequentially etch through unmasked portions of the dielectric spacer layer 50L and the continuous aluminum oxide-containing layer 39L. In one embodiment, the etch process may include an anisotropic etch process such as a reactive ion etch process that etches through the physically exposed portions of the dielectric spacer layer 50L. For example, if the dielectric spacer layer 50L includes a silicon oxide material, a reactive ion etch process may be performed, which may use a set of etch gases such as $CF_4/O_2$, $CF_4/CHF_3/Ar$, $C_2F_6$, $C_3F_8$, $C_4F_8/CO$, $C_5F_8$, and/or $CH_2F_2$.

Various contact via cavities (59A, 59B, 59C) may be formed through dielectric spacer layer 50L and the continuous aluminum oxide-containing layer 39L, and through the distal aluminum nitride layer 38 or partly into the distal aluminum nitride layer 38. The various contact via cavities (59A, 59B, 59C) may include at least one first contact via cavity 59A, at least one second contact via cavity 59B, and optionally at least one third contact via cavity 59C, and optionally any additional contact via cavity (not shown) that overlies a respective one of the metal interconnect structure 14. The first photoresist layer 51 may be subsequently removed, for example, by ashing.

Figure 6:
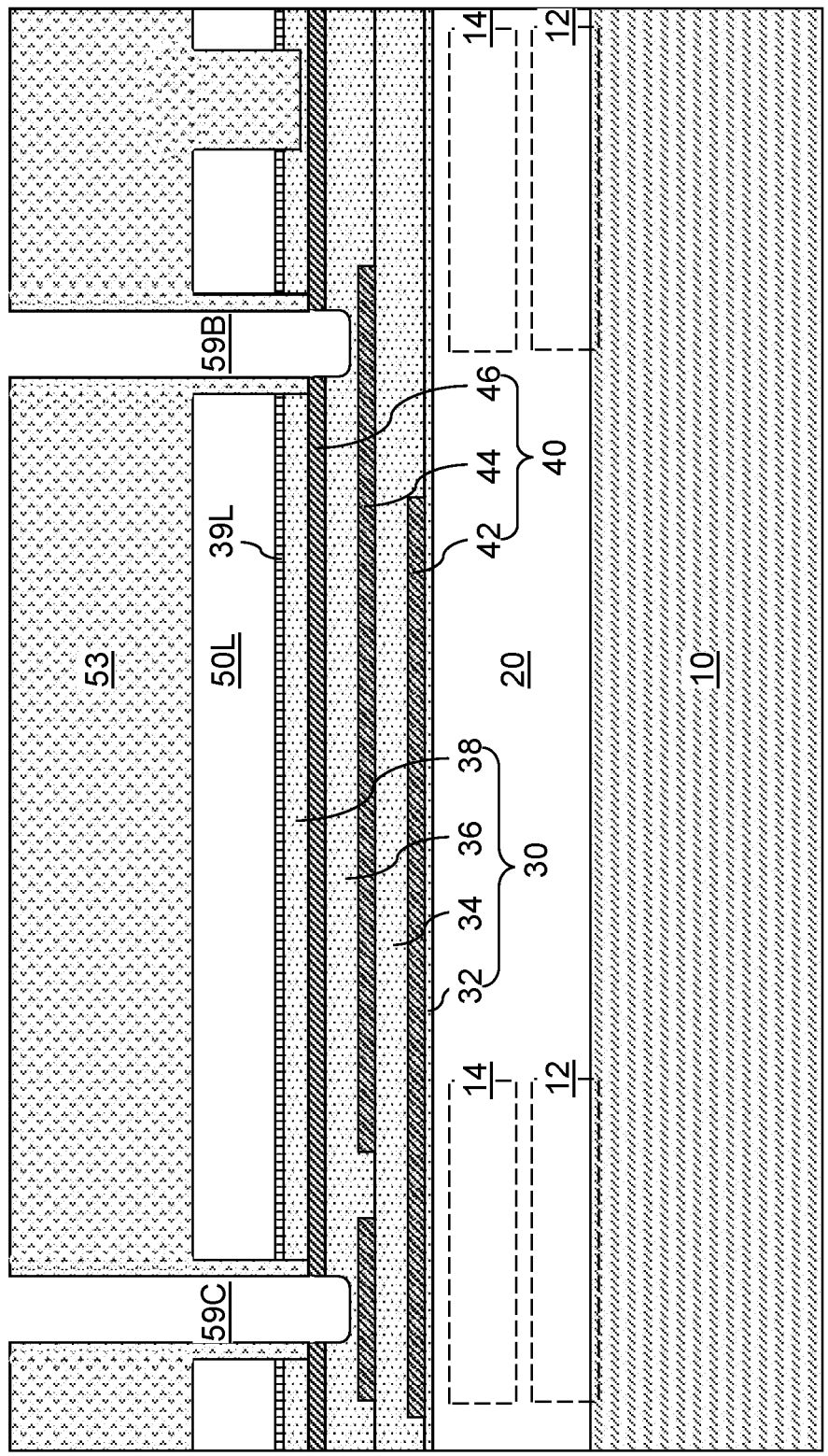
FIG. 6 is a vertical cross-sectional view of the exemplary structure after vertically extending a second contact via cavity and a third contact via cavity according to an embodiment of the present disclosure.

Referring to FIG. 6, a second photoresist layer 53 may be applied over the dielectric spacer layer 50L, and may be lithographically patterned to form openings therethrough. Each of the openings in the second photoresist layer 53 may be formed within areas of the second, third, and any additional contact via cavities (59B, 59C). An etch process may be performed to transfer the pattern in the second photoresist layer 53 through any underlying portion of the distal aluminum nitride layer 38, through the distal metal layer 46, and fully or partly through the second intermediate aluminum nitride layer 36. The etch process may include an anisotropic etch process such as a reactive ion etch process.

The etch process may include a plurality of etch steps that may sequentially etch through unmasked portions of the distal aluminum nitride layer 38 and the distal metal layer 46, and fully or partly through the second intermediate aluminum nitride layer 36.

The second, third, and any additional contact via cavities (59B, 59C) may be vertically extended through the distal aluminum nitride layer 38, through the distal metal layer 46, and fully or partly through the second intermediate aluminum nitride layer 36 while the at least one first contact via cavity 59A is covered with the second photoresist layer 53. The second photoresist layer 53 may be subsequently removed, for example, by ashing.

Figure 7:
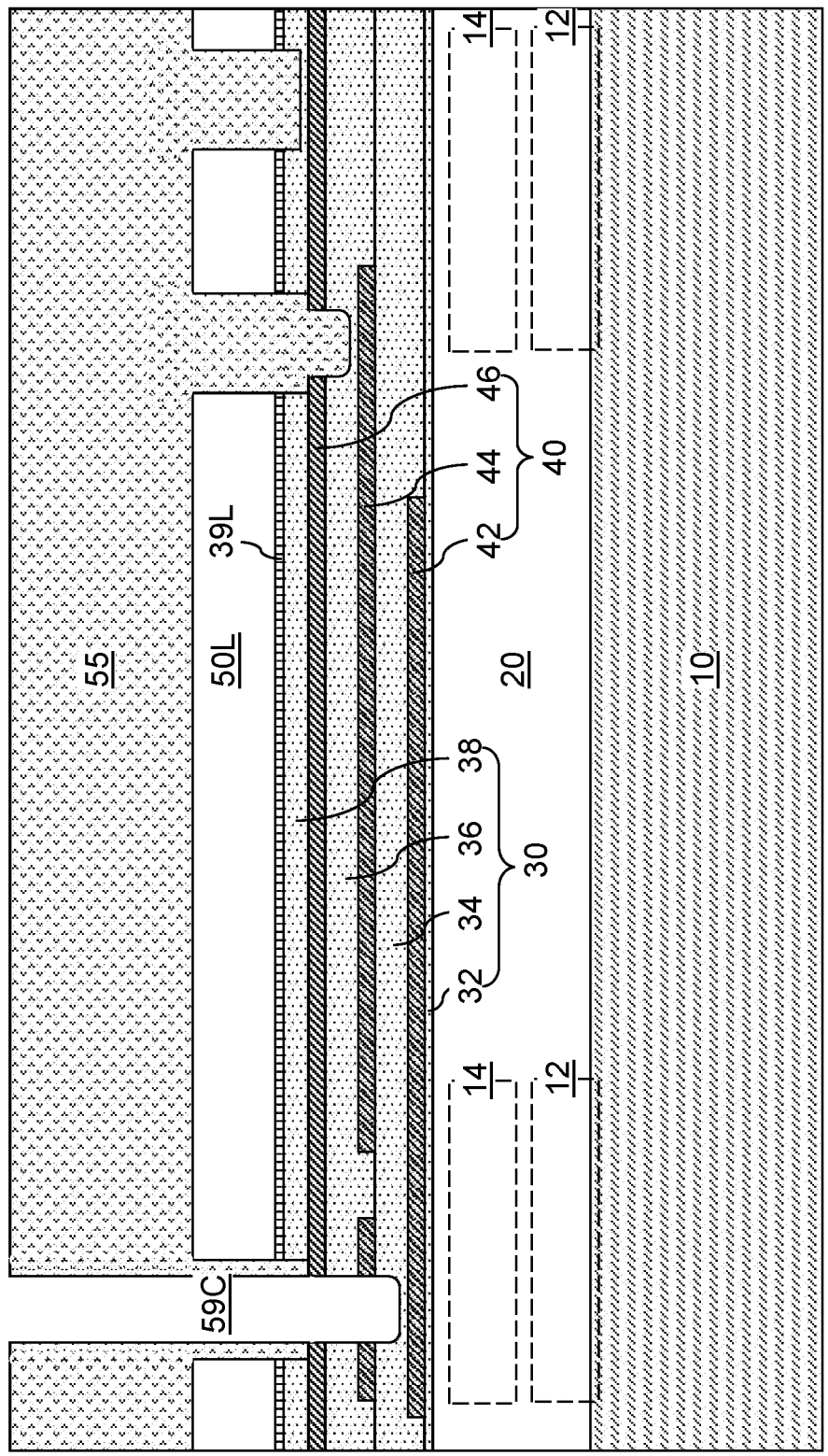
FIG. 7 is a vertical cross-sectional view of the exemplary structure after vertically extending the third contact via cavity according to an embodiment of the present disclosure.

Referring to FIG. 7, a third photoresist layer 55 may be applied over the dielectric spacer layer 50L, and may be lithographically patterned to form openings therethrough. Each of the openings in the third photoresist layer 53 may be formed within areas of the at least one third contact via cavity 59C and any additional contact via cavity, if present. An etch process may be performed to transfer the pattern in the third photoresist layer 55 through any underlying portion of the second intermediate aluminum nitride layer 36, through the intermediate metal layer 44, and fully or partly through the first intermediate aluminum nitride layer 34. The etch process may include an anisotropic etch process such as a reactive ion etch process. The etch process may include a plurality of etch steps that may sequentially etch through unmasked portions of the second intermediate aluminum nitride layer 36, through the intermediate metal layer 44, and fully or partly through the first intermediate aluminum nitride layer 34.

The at least one third contact via cavity 59C and any additional contact via cavity, if present, may be vertically extended through the second intermediate aluminum nitride layer 36, through the intermediate metal layer 44, and fully or partly through the first intermediate aluminum nitride layer 34 while the first and second contact via cavities (59A, 59B) are covered with the third photoresist layer 55. The third photoresist layer 55 may be subsequently removed, for example, by ashing.

Figure 8:
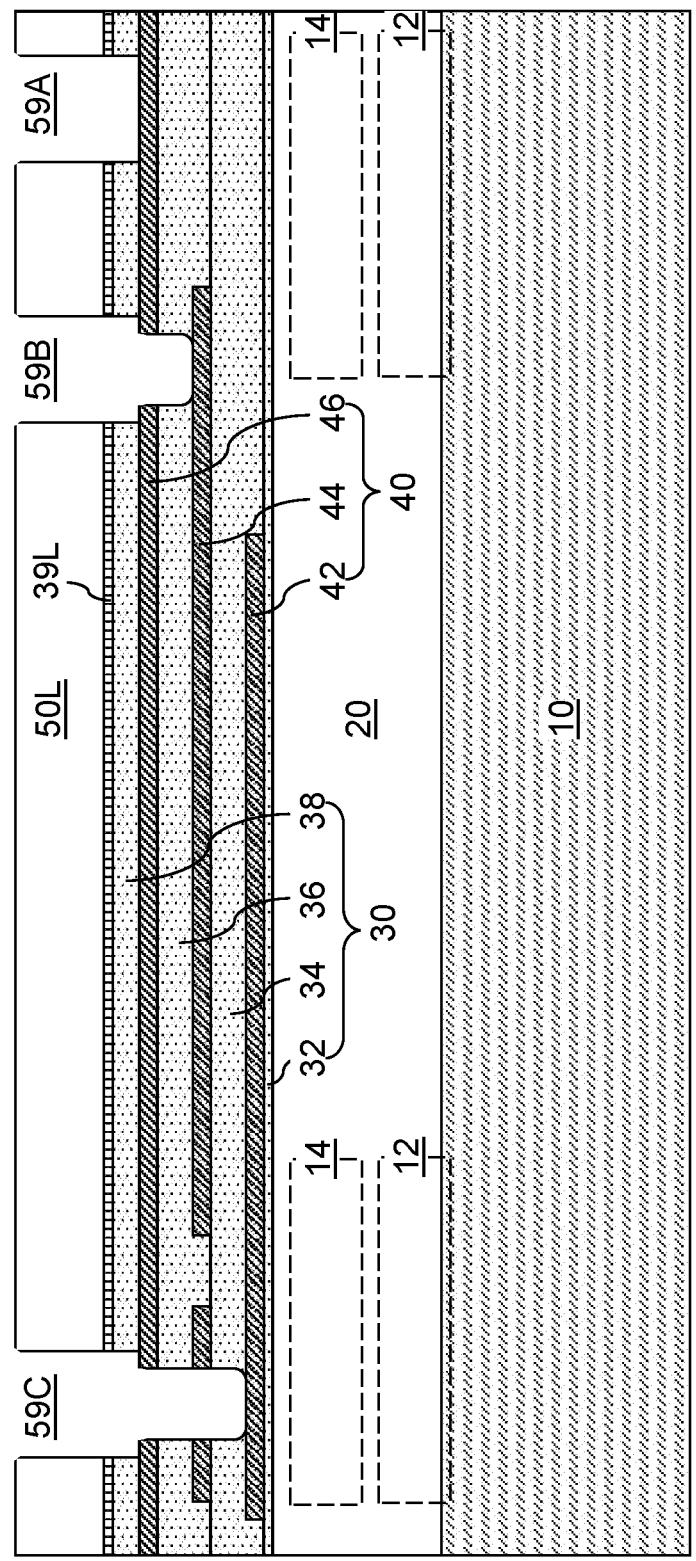
FIG. 8 is a vertical cross-sectional view of the exemplary structure after removing a patterned photoresist layer according to an embodiment of the present disclosure.

Referring to FIG. 8, an isotropic etch process may be performed to remove physically exposed portions of the aluminum nitride layers 30 that underlie each of the contact via cavities (59A, 59B, 59C). The isotropic etch process physically exposes portions of the top surfaces of the metal layers 40, and removes any interfacial compound or impurities from the physically exposed top surfaces of the metal layers 40 that underlie the contact via cavities (59A, 59B, 59C). For example, a wet etch using phosphoric acid may be performed to recess the physically exposed surfaces of the aluminum nitride layers 30, and to subsequently clean the physically exposed surfaces of the metal layers 40.

In some processes, a silicon oxide material (e.g., 50L) may be deposited directly on the top surface of a topmost aluminum nitride layer (e.g., 38). When a contact via cavity is formed through such layer stack and an isotropic wet etch process such as a phosphoric acid wet etch process is performed, an undercut is formed around each contact via cavity at the interface between the silicon oxide material and the topmost aluminum nitride layer. The lateral extent of an undercut in one direction may be in a range from 3-8 times the thickness of the topmost aluminum nitride layer depending on the process parameters of the phosphoric acid wet etch process. Adhesion test shows that the interface between the topmost aluminum nitride layer (e.g., 38) and the silicon oxide material (e.g., 50L) shows adhesion strength of 5B grade. Thus, poor adhesion between the topmost nitride layer (e.g., 38) and the silicon oxide material (e.g., 50L) is not a cause of formation of undercuts.

Without wishing to be bound by any particular theory, it is believed that the silicon oxide material (e.g., 50L) or other deposited dielectric material layers do not wet the top surface of the topmost aluminum nitride layer (e.g., 38). It is possible that the polycrystalline structure of the aluminum nitride layer (e.g., 38) provides surface topography that is not conducive to wetting by a subsequently deposited dielectric material (e.g., 50L). Thus, cavities on a scale of nanometers or sub-nanometers may be present at the interface between the topmost aluminum nitride layer (e.g., 38) and the deposited silicon oxide material (e.g., 50L). It is also possible that capillary force plays a role in inducing lateral permeation of molecules of an isotropic etchant during the isotropic wet etch process. Irrespective of the validity of the hypothesis presented above and irrespective of the true mechanism for formation of undercuts, formation of undercuts at an interface between an aluminum nitride layer (e.g., 38) and silicon oxide material (e.g., 50L) and other similar materials during a wet etch process such as a phosphoric acid wet etch process is a well-established fact.

A significant reduction or elimination of an undercut at the interface between the topmost aluminum nitride layer 38 and a dielectric spacer layer 50L in embodiments in which the dielectric spacer layer 50L includes a silicon oxide material. It is theorized that conversion of a surface portion of an aluminum nitride layer into an aluminum oxide-containing layer provides an impermeable interface between the remaining portion of the aluminum nitride layer and the aluminum oxide-containing layer. Further, it is theorized that the physically exposed surface of the aluminum oxide-containing layer is conducive to formation of another impermeable interface when a dielectric material is subsequently deposited. Without wishing to be bound by a particular theory, it is possible that the amorphous nature of the physically exposed surface of the aluminum oxide-containing layer may be the cause of formation of an impermeable interface upon deposition of a dielectric spacer layer. It is believed that formation of such an impermeable interface is possible for most dielectric materials, and particularly to dielectric materials that do not include a metal (such as a dielectric metal oxide or a dielectric metal nitride).

Generally, the contact via cavities (59A, 59B, 59C) may vertically extend through the dielectric spacer layer 50L, the continuous aluminum oxide-containing layer 39L, and the distal aluminum nitride layer 38 and optionally through one or more metal layers 40 and optionally through one or more additional aluminum nitride layers 30. The contact via cavities (59A, 59B, 59C) may vertically extend down to a respective portion of the at least one metal layer 40. Formation of the contact via cavities (59A, 59B, 59C) may be effected by a combination of at least one anisotropic etch process and a terminal etch process, which may be a wet etch process that etches physically exposed portions of the aluminum nitride layers 30 (including the distal aluminum nitride layer 38) while suppressing formation of an undercut in the aluminum nitride layers 30.

Figure 9:
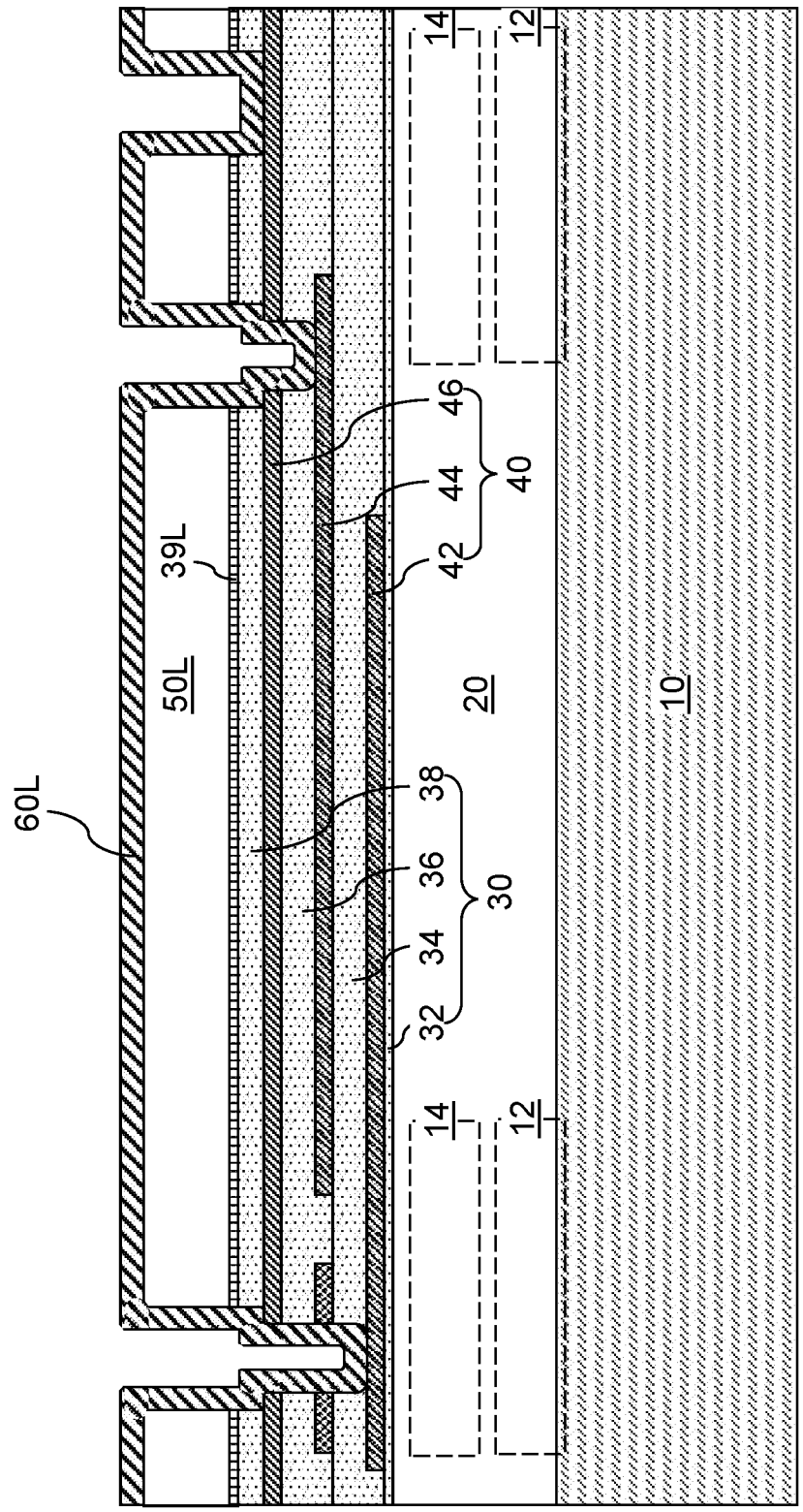
FIG. 9 is a vertical cross-sectional view of the exemplary structure after deposition of a conductive material layer according to an embodiment of the present disclosure.

Referring to FIG. 9, at least one conductive material may be deposited to form a conductive material layer 60L as a continuously extending film that extends into each of the contact via cavities (59A, 59B, 59C) and over the dielectric spacer layer 50L. The at least one conductive material may include a metallic liner and a metallic fill material. For example, the metallic liner may include a conductive metallic nitride material such as TiN, TaN, and/or WN, and may have a thickness in a range from 3 nm to 100 nm, although lesser and greater thicknesses may also be used. Other suitable materials for the metallic liner are within the contemplated scope of disclosure. The metallic liner may be deposited by physical vapor deposition or chemical vapor deposition. The metallic fill material may include a metal, a metal alloy, or a heavily-doped semiconductor material. For example, the metallic fill material may include Cu, Al, Ag, Au, W, Mo, Ru, Co, another elemental metal, an alloy thereof (such as an Al—Cu alloy), and/or a layer stack thereof. Other suitable materials for the metallic fill material are within the contemplated scope of disclosure. The thickness of the metallic fill material, as measured above the dielectric spacer layer 50L, may be in a range from 100 nm to 5,000 nm, although lesser and greater thicknesses may also be used. The metallic fill material may be deposited by physical vapor deposition, chemical vapor deposition, electroplating, vacuum evaporation, or other deposition methods.

Figure 10:
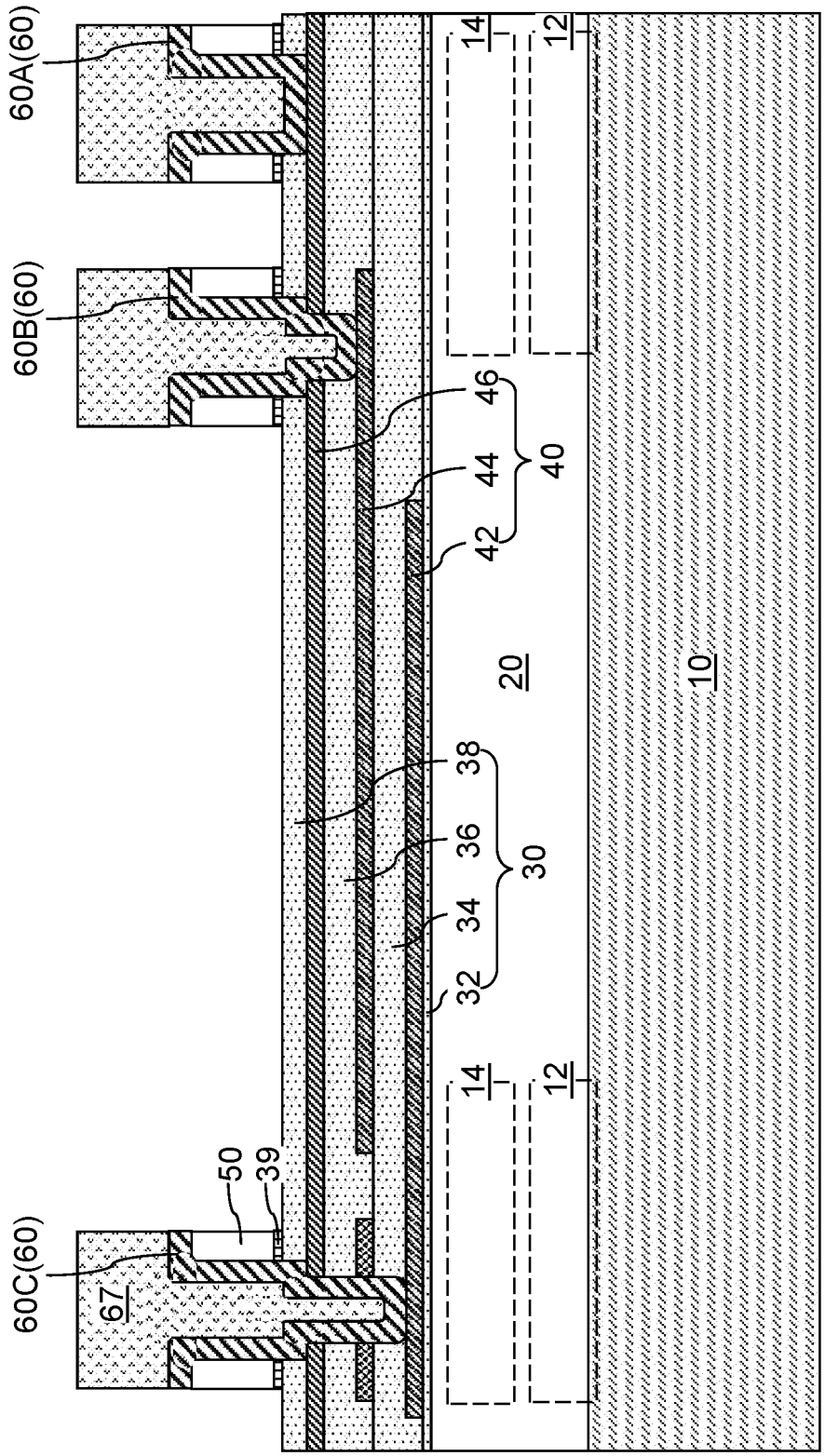
FIG. 10 is a vertical cross-sectional view of the exemplary structure after patterning the conductive material layer, the dielectric spacer layer, and optionally through the aluminum oxide-containing layer according to an embodiment of the present disclosure.

Referring to FIG. 10, a photoresist layer may be applied over the conductive material layer, and may be lithographically patterned to form discrete photoresist material portions 67. An anisotropic etch process may be performed to transfer the pattern of the discrete photoresist material portions 67 through the conductive material layer 60L and the dielectric spacer layer 50L, and optionally through the continuous aluminum oxide-containing layer 39L. Each patterned portion of the conductive material layer 60L comprises a contact via structure 60, which may include at least one first contact via structure 60A formed in a respective first contact via cavity 59A, at least one second contact via structure 60B formed in a respective second contact via cavity 59B, at least one third contact via structure 60C formed in a respective third contact via cavity 59C, and optionally at least one additional contact via structure, if any, that is formed in a respective additional contact via cavity that extends to a respective metal interconnect structure 14.

The dielectric spacer layer 50L may be patterned into dielectric spacer structures 50 that laterally surround a vertically-extending portion of a respective contact via structure 60. Each dielectric spacer structure 50 may have a vertical or tapered inner sidewall and a vertical or tapered outer sidewall. In one embodiment, each dielectric spacer structure 50 may be include a cylindrical opening therethrough, and thus, may be topologically homeomorphic to a torus, i.e., may be continuously deformed into a shape of a torus without formation of a new hole or removal of an existing hole. The outer sidewall of each dielectric spacer structure 50 may be vertically coincident with, i.e., located within a same vertical plane as, a sidewall of an overlying portion of a contact via structure 60.

The continuous aluminum oxide-containing layer 39L may be patterned into multiple aluminum oxide-containing layers 39. Each aluminum oxide-containing layer 39 may include a graded aluminum nitride-oxide layer 39A. Each aluminum oxide-containing layer 39 may include an aluminum oxide layer 39B as illustrated in FIG. 3A, or may consist of the graded aluminum nitride-oxide layer 39A as illustrated in FIG. 3B. Each dielectric spacer structure 50 may contact a top surface of a respective aluminum oxide-containing layer 39. In one embodiment, each dielectric spacer structure 50 may comprise, and/or may consist essentially of, a dielectric material that is essentially free of a metallic element, such as a silicon oxide material.

Figure 11:
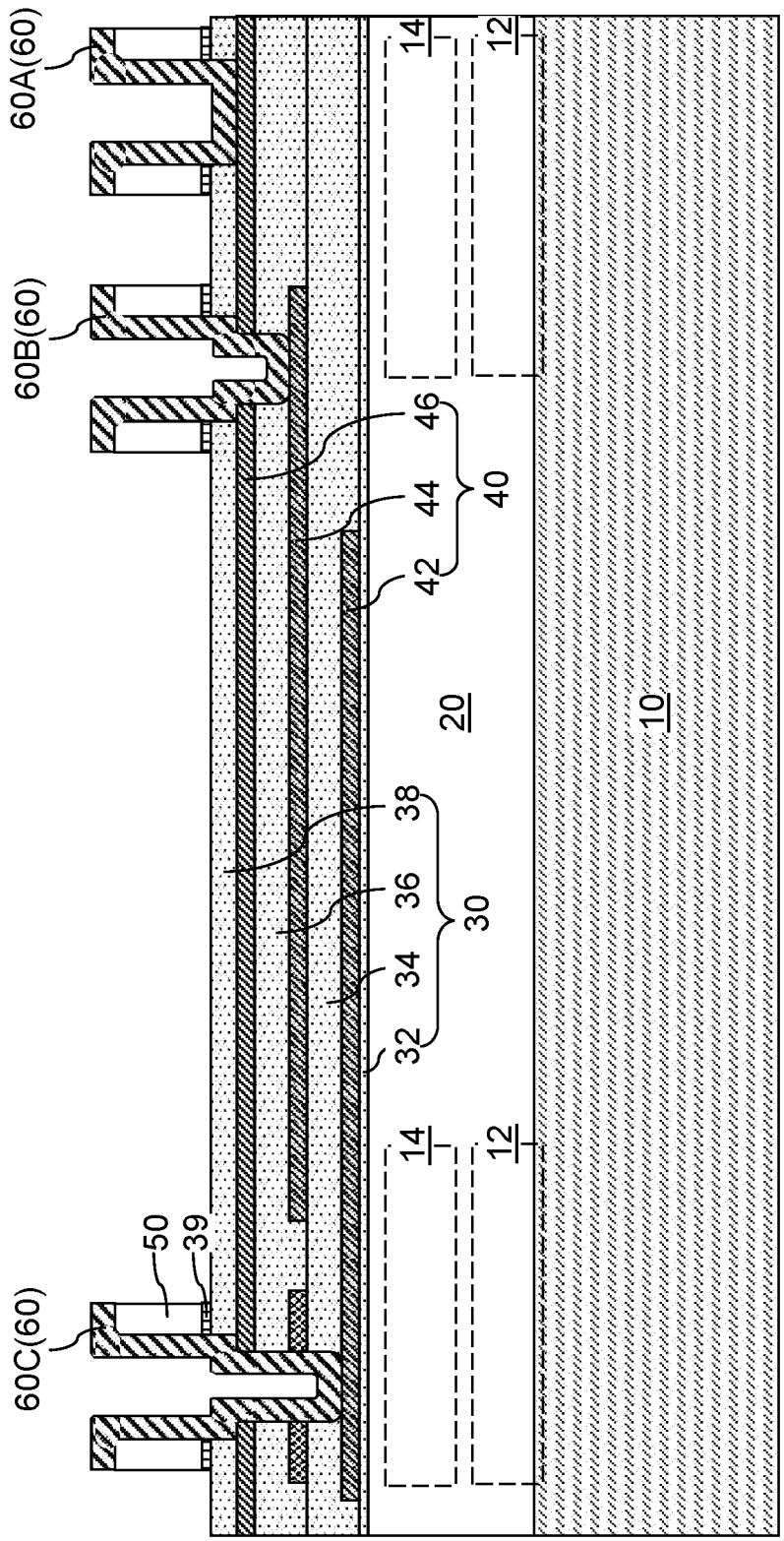
FIG. 11 is a vertical cross-sectional view of the exemplary structure after removal of a patterned photoresist layer according to an embodiment of the present disclosure.

Referring to FIG. 11, the discrete photoresist material portions 67 may be removed, for example, by ashing.

Generally, at least two contact via structures 60 may contact a respective portion of the at least one metal layer 40. Each of the at least two contact via structures 60 may include a respective top portion that is vertically spaced from the interlayer dielectric material layers (such as the aluminum nitride layers 30) by an aluminum oxide-containing layer 39 and a respective dielectric spacer structure 50.

In one embodiment, at least one metal layer 40 may be formed in interlayer dielectric material layers (which may comprise aluminum nitride layers 30) that overlie a substrate 10. The interlayer dielectric material layers may comprise a distal aluminum nitride layer 38 overlying a distal metal layer 46 (i.e., the topmost metal layer) of the at least one metal layer 40. In one embodiment, the interlayer dielectric material layers may comprise at least one additional aluminum nitride layer (such as the proximal aluminum nitride layer 32, the first intermediate aluminum nitride layer 34, and the second aluminum nitride layer 36) located between the distal metal layer 46 and the substrate 10.

In one embodiment, the at least one metal layer 40 may comprise a plurality of metal layers 40, and one of the at least two contact via structures (such as a first contact via structure 60A) may contact the distal metal layer 46 (i.e., the topmost metal layer) and another of the at least two contact via structures (such as a second contact via structure 60B or a third contact via structure 60C) may contact a metal layer (such as the proximal metal layer 42 or the intermediate metal layer 44) selected from the plurality of metal layers 40 other than the distal metal layer 46. In one embodiment, the plurality of metal layers 40 comprise a plurality of molybdenum layers having a respective thickness in a range from 5 nm to 100 nm.

In one embodiment, the exemplary structure may include a MEMS device containing a piezoelectric transducer that uses the at least two contact via structures 60 as electrical nodes and uses at least one, and/or each, of the aluminum nitride layers 30 as a piezoelectric conversion element. In one embodiment, the piezoelectric transducer may include a microphone or a speaker.

Figure 12:
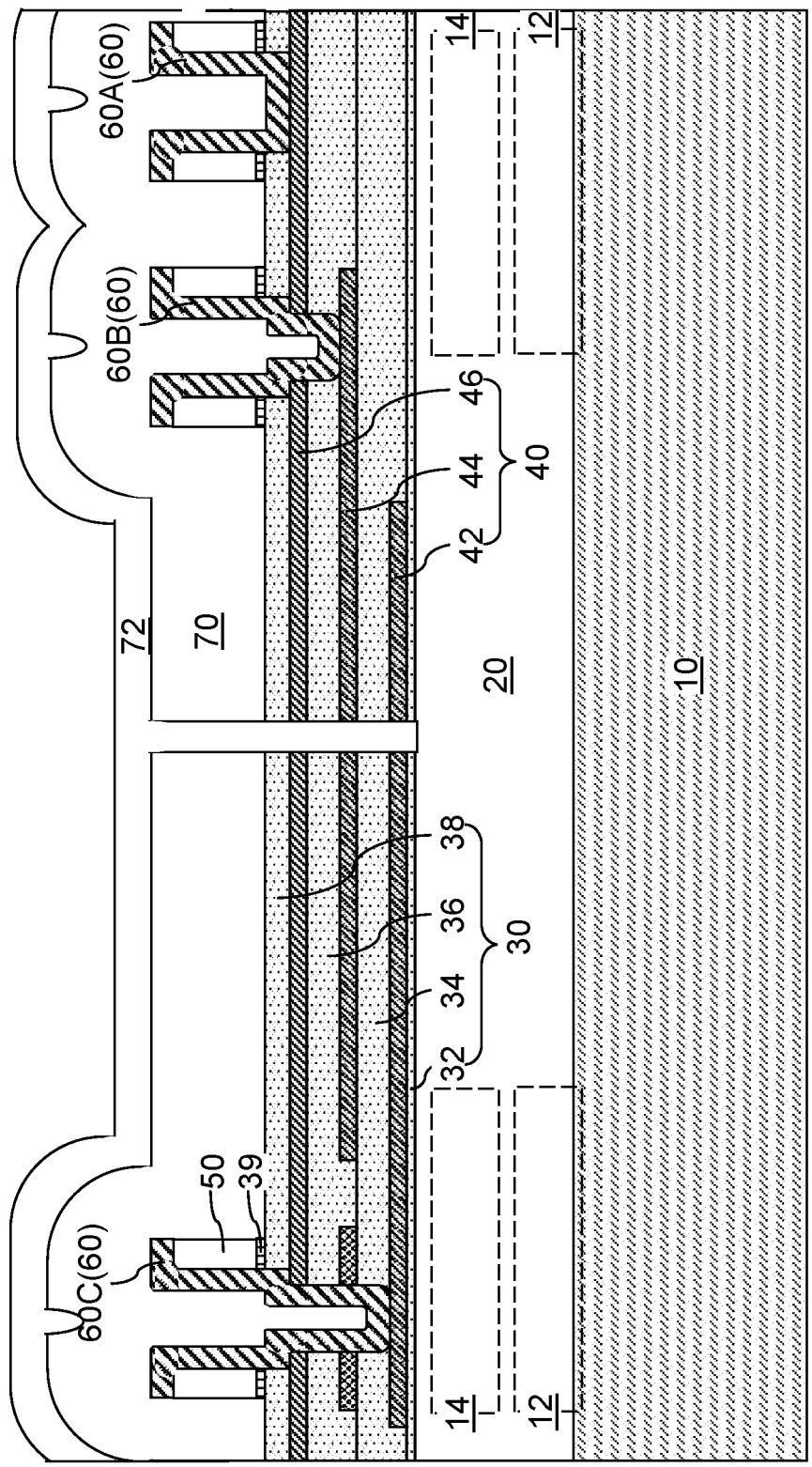
FIG. 12 is a vertical cross-sectional view of the exemplary structure after formation of at least one front-side passivation layer according to an embodiment of the present disclosure.

Referring to FIG. 12, at least one front-side passivation layer (70, 72) can be deposited over the exemplary structure by a conformal or non-conformal deposition process. For example, a first front-side passivation layer 70 can deposit a first dielectric material such as undoped silicate glass, a doped silicate glass, organosilicate glass, or a dielectric polymer material. Optionally, at least one opening can be formed through the aluminum nitride layers 30 and the metal layers 40 by forming an patterned photoresist layer (not shown) over the first front-side passivation layer 70, and by anisotropically etching unmasked portions of the aluminum nitride layers 30 and the metal layers 40. A second front-side passivation layer 72 can be deposited in the at least one opening and over the first front-side passivation layer 70. The total thickness of planar regions of the at least one front-side passivation layer (70, 72) can be in a range from 1 micron to 30 microns, although lesser and greater thicknesses can also be employed.

Figure 13:
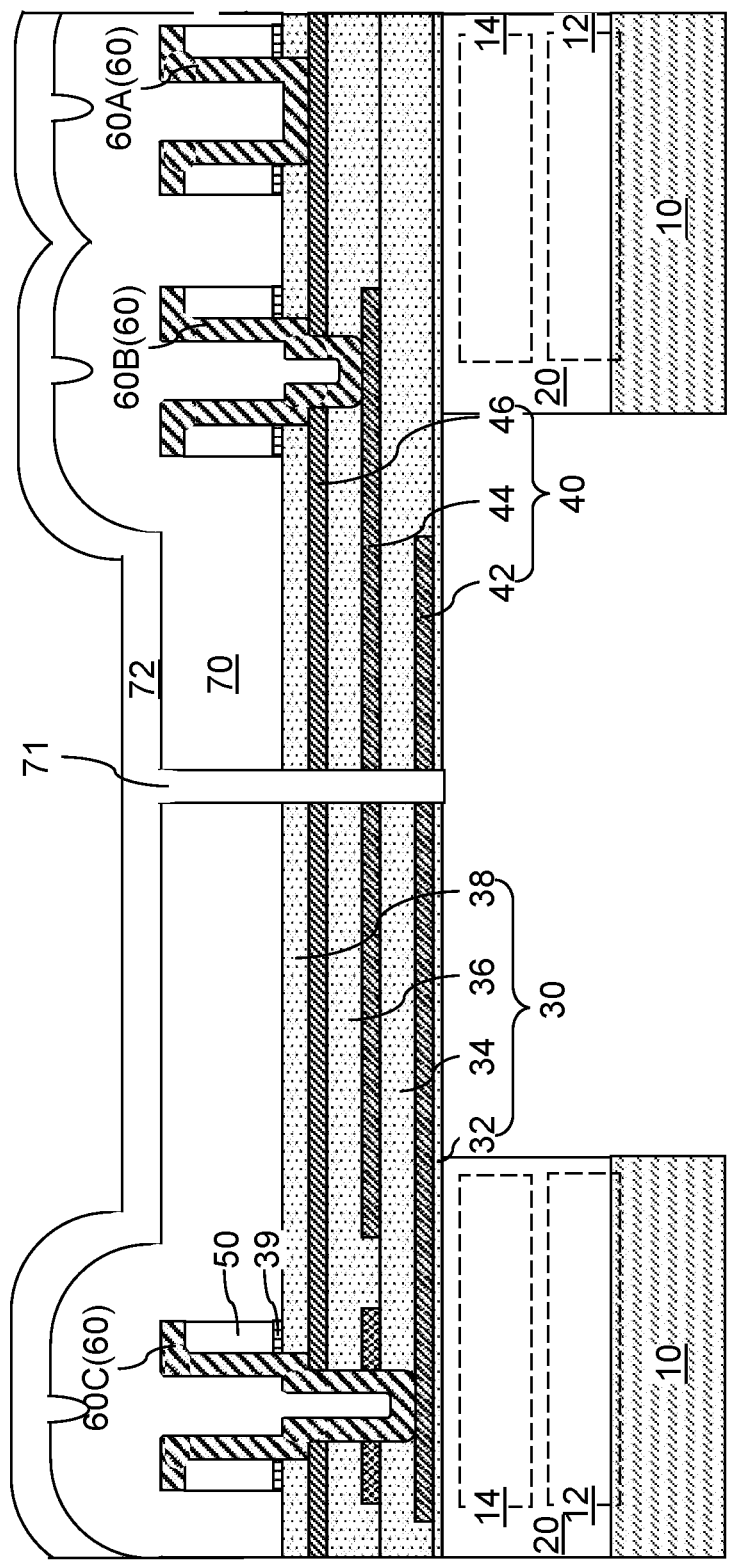
FIG. 13 is a vertical cross-sectional view of the exemplary structure after backside patterning according to an embodiment of the present disclosure.

Referring to FIG. 13, the substrate 10 can be thinned, for example, by grinding, polishing, an anisotropic etch process, or an isotropic etch process. The thickness of the substrate 10 after thinning can be in a range from 1 micron to 60 microns, although lesser and greater thicknesses can also be employed. A patterned etch mask layer (not shown) can be formed over the polished backside surface of the substrate 10, and an etch process can be performed to etch through the least one dielectric buffer layer 20. The aluminum nitride layers 30 and the metal layers 40 can be employed as an etch stop structure for the etch process. The etch process may be an isotropic etch process or an anisotropic etch process. The patterned etch mask layer can be subsequently removed, for example, by ashing.

Figure 14:
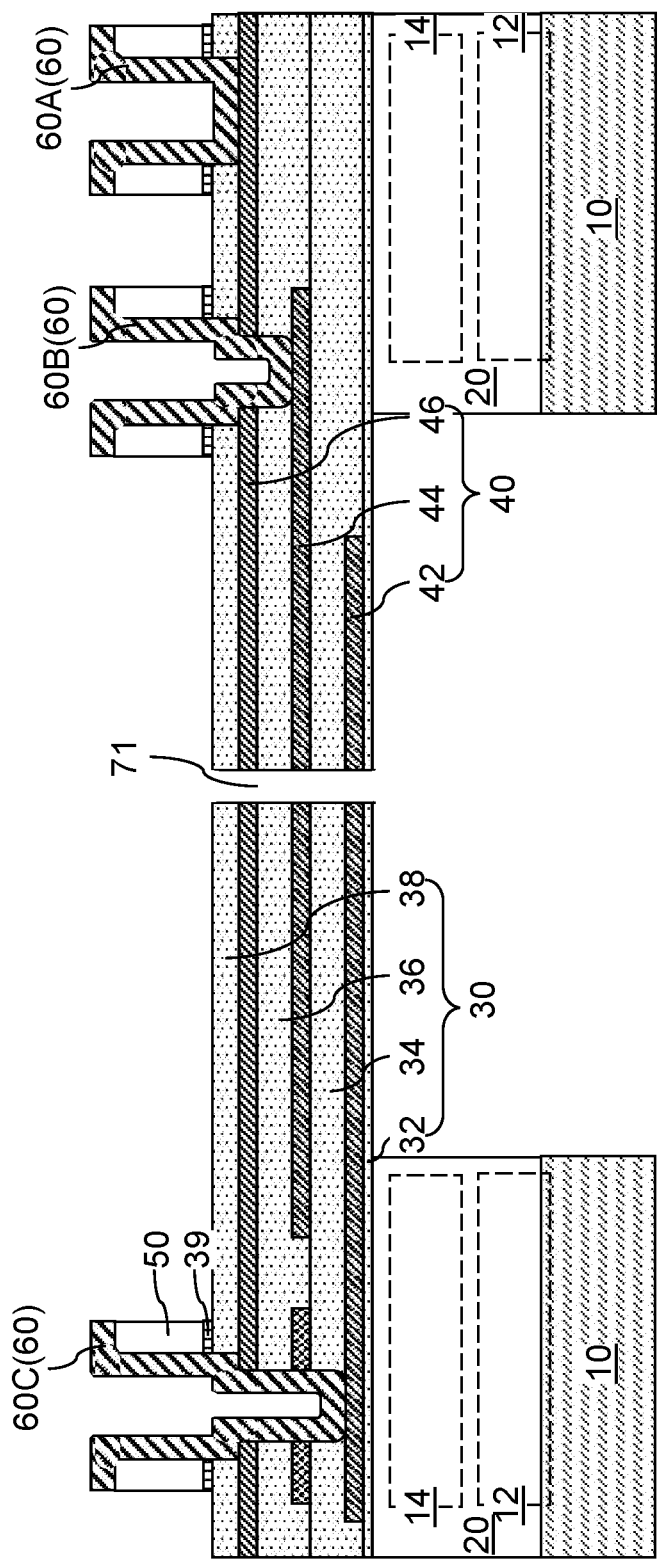
FIG. 14 is a vertical cross-sectional view of the exemplary structure after removal of the at least one front-side passivation layer according to an embodiment of the present disclosure.

Referring to FIG. 14, the at least one front-side passivation layer (70, 72) can be removed selective to the aluminum nitride layers 30, the metal layers 40, and the contact via structures 60. For example, a wet etch process employing dilute hydrofluoric acid can be employed to etch the at least one front-side passivation layer (70, 72). Solder balls (not shown) can be attached to the contact via structures 60, and the example structure can be attached to a semiconductor die or a packaging substrate employing C4 bonding or wire-bonding.

Figure 15:
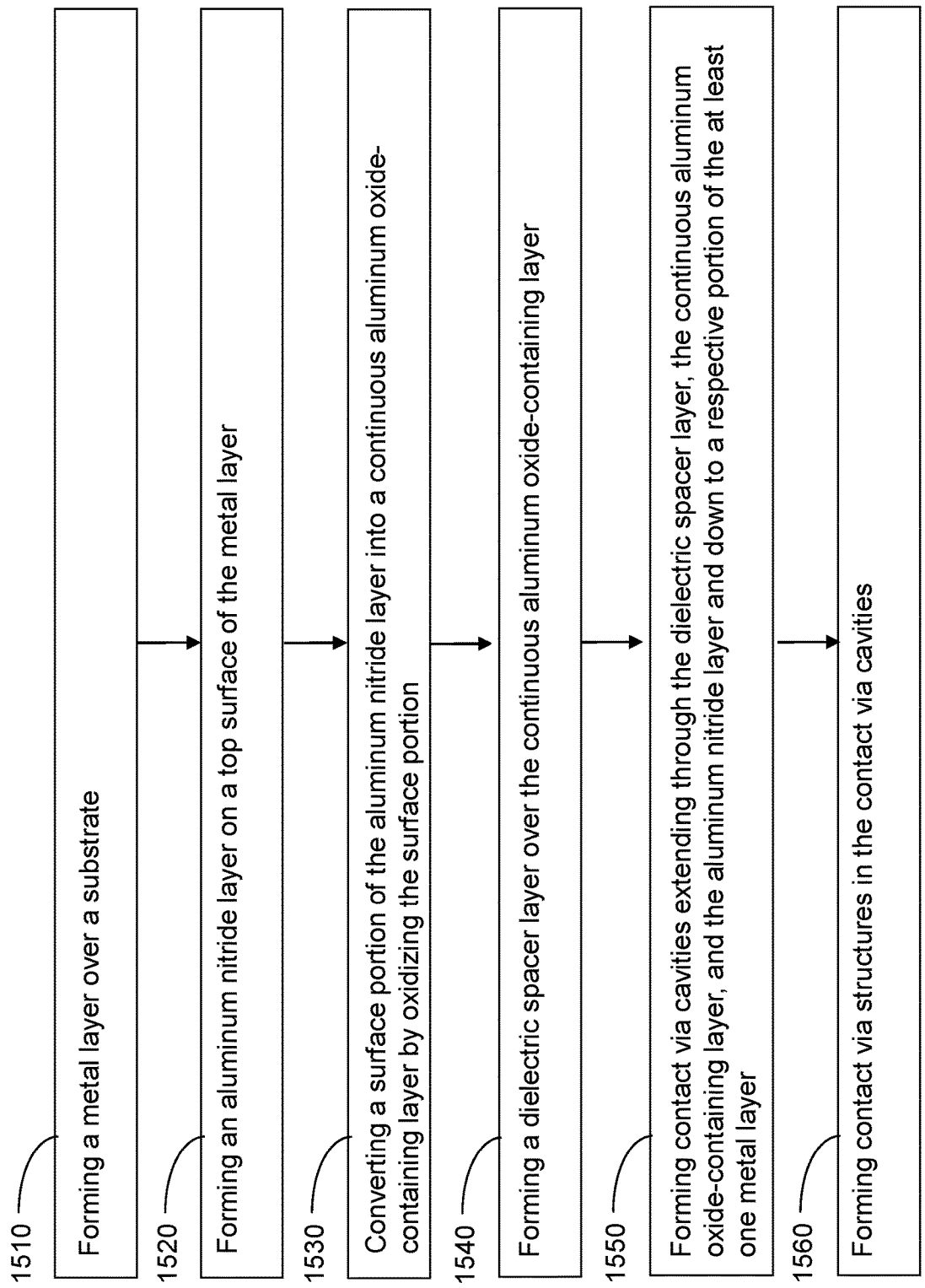
FIG. 15 is a flowchart that illustrates the general processing steps of the methods of the present disclosure.

Referring to FIG. 15, a flowchart illustrates a general processing sequence that may be used to form the various embodiments of the present disclosure. Referring to step 1510, a metal layer 40 (such as a distal metal layer 46) may be formed over a substrate 10. Referring to step 1520, an aluminum nitride layer 30 (such as a distal aluminum nitride layer 38) may be formed on a top surface of the metal layer 40. Referring to step 1530, a surface portion of the aluminum nitride layer 30 may be converted into a continuous aluminum oxide-containing layer 39L by oxidizing the surface portion. Referring to step 1540, a dielectric spacer layer 50L may be formed over the continuous aluminum oxide-containing layer 39L. Referring to step 1550, contact via cavities (59A, 59B, 59C) extending through the dielectric spacer layer 50L, the continuous aluminum oxide-containing layer 39L, and the aluminum nitride layer 30 and down to a respective portion of the at least one metal layer 40 may be formed using etch processes that contain a wet etch step that etches physically exposed portions of the aluminum nitride layer 30 while suppressing formation of an undercut in the aluminum nitride layer 30. Referring to step 1560, contact via structures 60 are formed in the contact via cavities (59A, 59B, 59C).

By oxidizing the topmost aluminum nitride layer 38 to form an aluminum nitride-oxide layer 39, the aluminum nitride layer 38 may be protected from an undercut that may occur upon the introduction of a phosphoric acid in a wet etch process. The presence of the aluminum nitride-oxide layer 39L obviates the need for a sacrificial molybdenum layer that may be used in a conventional process. By obviating the need for a sacrificial molybdenum layer, the operations of both depositing the additional sacrificial layer and removing the remnants of the sacrificial layer may be avoided. Such avoidance simplifies the overall manufacturing of the microstructure and reduces the cycle time to manufacture the microstructure.

Referring to all drawings and according to various embodiments of the present disclosure, a microstructure (which may include a micro-electromechanical system (MEMS) device) is provided. The microstructure includes at least one metal layer 40 formed within interlayer dielectric material layers (comprising aluminum nitride layers 30) that overlie a substrate 10. The interlayer dielectric material layers comprise an aluminum nitride layer (such as a distal aluminum nitride layer 38) overlying a topmost metal layer (such as a distal metal layer 46) of the at least one metal layer 40. The microstructure includes at least one contact via structure 60 contacting a respective one of the at least one metal layer 40 and including a respective top portion that is vertically spaced from the interlayer dielectric material layers (such as the aluminum nitride layers 30) by an aluminum oxide-containing layer 39 and a respective dielectric spacer structure 50 which comprises a dielectric material that is essentially free of a metallic element. The aluminum oxide-containing layer 39 contacts a respective portion of a top surface of the aluminum nitride layer (such as the distal aluminum nitride layer 38).

According to another aspect of the present disclosure, a micro-electromechanical system (MEMS) device is provided, which comprises: at least one metal layer 40 formed within interlayer dielectric material layers (comprising the aluminum nitride layers 30) that overlie a substrate 10. The interlayer dielectric material layers comprise an aluminum nitride layer (such as a distal aluminum nitride layer 38) overlying a topmost metal layer (such as a distal metal layer 46) of the at least one metal layer 40. The MEMS device comprises: at least two contact via structures 60 contacting a respective portion of the at least one metal layer 40 and including a respective top portion that is vertically spaced from the interlayer dielectric material layers by an aluminum oxide-containing layer 39 and a respective dielectric spacer structure 50. The MEMS device comprises a piezoelectric transducer that uses the at least two contact via structures 60 as electrical nodes and uses the aluminum nitride layer (such as the distal aluminum nitride layer 38) as a piezoelectric conversion element.

According to another aspect of the present disclosure, a method of patterning a microstructure is provided. The method includes the operation of forming a metal layer 40 over a substrate 10 and forming an aluminum nitride layer 38 on a top surface of the metal layer 40. The method further including the operation of converting a surface portion of the aluminum nitride layer 38 into a continuous aluminum oxide-containing layer 39 by oxidizing the surface portion. The method also including the operation of forming a dielectric spacer layer 50 over the continuous aluminum oxide-containing layer 39. The method also including the operation of forming contact via cavities 59 extending through the dielectric spacer layer 30, the continuous aluminum oxide-containing layer 39, and the aluminum nitride layer 38 and down to a respective portion of the at least one metal layer 40 using etch processes that contain a wet etch step that etches physically exposed portions of the aluminum nitride layer 38 while suppressing formation of an undercut in the aluminum nitride layer 38. The method also including the operation of forming contact via structures 60 in the contact via cavities 59.

The various embodiments of the present disclosure may be used to provide a microstructure including an aluminum nitride layer, an aluminum oxide-containing layer, and a dielectric spacer structure 50 within any undercut at an interface between the aluminum oxide-containing layer and the dielectric spacer structure 50. A structurally robust contact via structure 60 may be formed on underlying metal layers 40. The microstructure may include a MEMS device containing a piezoelectric element. The enhanced structural integrity of the contact via structure 60 and the dielectric spacer structure 50 may increase the mechanical strength and reliability of the MEMS device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A microstructure comprising:
at least one metal layer formed within interlayer dielectric material layers that overlie a substrate, wherein the interlayer dielectric material layers comprise an aluminum nitride layer overlying a topmost metal layer of the at least one metal layer; and
at least one contact via structure contacting a respective one of the at least one metal layer and including a respective top portion that is vertically spaced from the interlayer dielectric material layers by an aluminum oxide-containing layer and a respective dielectric spacer structure which comprises a dielectric material that is essentially free of a metallic element,
wherein the aluminum oxide-containing layer contacts a respective portion of a top surface of the aluminum nitride layer.

2. The microstructure of claim 1, wherein the aluminum oxide-containing layer comprises a graded aluminum nitride-oxide layer having a compositional gradient in which an oxygen atomic concentration increases from zero at an interface with a topmost aluminum nitride layer to a percentage in a range from 50% to 60% at a distal surface that is spaced from the interface with the topmost aluminum nitride layer.

3. The microstructure of claim 2, wherein:
the aluminum oxide-containing layer comprises an aluminum oxide layer that contacts the graded aluminum nitride-oxide layer at the distal surface; and
the oxygen atomic concentration is 60% at the distal surface.

4. The microstructure of claim 2, wherein the distal surface contacts a bottom surface of the dielectric spacer structure.

5. The microstructure of claim 1, wherein the dielectric spacer structure comprises a silicon oxide material.

6. The microstructure of claim 1, wherein the aluminum oxide-containing layer has a thickness in a range from 3 nm to 60 nm.

7. A micro-electromechanical system (MEMS) device, comprising:
at least one metal layer formed within interlayer dielectric material layers that overlie a substrate, wherein the interlayer dielectric material layers comprise an aluminum nitride layer overlying a topmost metal layer of the at least one metal layer; and
at least two contact via structures contacting a respective portion of the at least one metal layer and including a respective top portion that is vertically spaced from the interlayer dielectric material layers by a respective dielectric spacer structure and an aluminum oxide-containing layer,
wherein the MEMS device comprises a piezoelectric transducer that uses the at least two contact via structures as electrical nodes and uses the aluminum nitride layer as a piezoelectric conversion element.

8. The MEMS device of claim 7, wherein:
the at least one metal layer comprises a plurality of metal layers;
one of the at least two contact via structures contacts the topmost metal layer; and
another of the at least two contact via structures contacts a metal layer selected from the plurality of metal layers other than the topmost metal layer.

9. The MEMS device of claim 8, wherein the interlayer dielectric material layers comprise at least one additional aluminum nitride layer located between the topmost metal layer and the substrate.

10. The MEMS device of claim 8, wherein the plurality of metal layers comprise a plurality of molybdenum layers having a respective thickness in a range from 5 nm to 100 nm.

11. The MEMS device of claim 7, wherein the dielectric spacer structure contacts a top surface of the aluminum oxide-containing layer, and comprises a dielectric material that is essentially free of a metallic element.

12. The MEMS device of claim 11, wherein the aluminum oxide-containing layer comprises a graded aluminum nitride-oxide layer having a compositional gradient in which an oxygen atomic concentration increases from zero at an interface with a topmost aluminum nitride layer to a percentage in a range from 50% to 60% at a distal surface that is spaced from the interface with the topmost aluminum nitride layer.

13. The MEMS device of claim 11, wherein:
the aluminum oxide-containing layer comprises an aluminum oxide layer that contacts the graded aluminum nitride-oxide layer at the distal surface; and
the oxygen atomic concentration is 60% at the distal surface.

14. The MEMS device of claim 11, wherein the distal surface contacts a bottom surface of the dielectric spacer structure.

15. The MEMS device of claim 7, wherein:
the dielectric spacer structure comprises a silicon oxide material; and
the aluminum oxide-containing layer has a thickness in a range from 3 nm to 60 nm.

16. A micro-electromechanical system (MEMS) device, comprising:
semiconductor devices located on a top surface of a substrate;
metal interconnect structures embedded in at least one dielectric buffer layer overlying the substrate and electrically connected to the semiconductor devices;
at least one metal layer located within interlayer dielectric material layers that overlie the at least one dielectric buffer layer, wherein the interlayer dielectric material layers comprise an aluminum nitride layer overlying a topmost metal layer of the at least one metal layer;
at least two contact via structures contacting a respective portion of the at least one metal layer and including a respective top portion that is vertically spaced from the interlayer dielectric material layers by a respective dielectric spacer structure and an aluminum oxide-containing layer; and
a piezoelectric transducer that uses the at least two contact via structures as electrical nodes and uses the aluminum nitride layer as a piezoelectric conversion element.

17. The MEMS device of claim 16, wherein:
the at least one metal layer comprises a plurality of metal layers;
one of the at least two contact via structures contacts the topmost metal layer; and
another of the at least two contact via structures contacts a metal layer selected from the plurality of metal layers other than the topmost metal layer.

18. The MEMS device of claim 17, wherein the interlayer dielectric material layers comprise at least one additional aluminum nitride layer located between the topmost metal layer and the substrate.

19. The MEMS device of claim 17, wherein the plurality of metal layers comprise a plurality of molybdenum layers having a respective thickness in a range from 5 nm to 100 nm.

20. The MEMS device of claim 16, wherein the dielectric spacer structure contacts a top surface of the aluminum oxide-containing layer, and comprises a dielectric material that is essentially free of a metallic element.

* * * * *